(12) United States Patent
Eto et al.

(10) Patent No.: US 8,760,053 B2
(45) Date of Patent: Jun. 24, 2014

(54) POWER SUPPLY CONTROL DEVICE, PLASMA PROCESSING DEVICE, AND PLASMA PROCESSING METHOD

(75) Inventors: Hideo Eto, Mie (JP); Nobuyasu Nishiyama, Mie (JP); Makoto Saito, Mie (JP); Keiji Suzuki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 510 days.

(21) Appl. No.: 13/198,356

(22) Filed: Aug. 4, 2011

(65) Prior Publication Data

US 2012/0038277 A1   Feb. 16, 2012

(30) Foreign Application Priority Data

Aug. 11, 2010 (JP) ................................ 2010-180433
May 6, 2011 (JP) ................................ 2011-103631

(51) Int. Cl.
*H05B 31/26* (2006.01)
*H03H 7/38* (2006.01)

(52) U.S. Cl.
USPC ....................................... 315/111.21; 333/32

(58) Field of Classification Search
USPC ............. 315/111.21, 111.41, 111.51, 111.71, 315/111.81, 111.91; 333/32, 34, 35
See application file for complete search history.

(56) References Cited

U.S. PATENT DOCUMENTS

| | | | | |
|---|---|---|---|---|
| 2006/0220574 A1* | 10/2006 | Ogawa | ...................... | 315/111.21 |
| 2009/0242516 A1* | 10/2009 | Honda et al. | ..................... | 216/71 |
| 2009/0255800 A1* | 10/2009 | Koshimizu | ..................... | 204/164 |

FOREIGN PATENT DOCUMENTS

| | | |
|---|---|---|
| JP | 04-143280 | 5/1992 |
| JP | 2003-273035 | 9/2003 |
| JP | 2004-096019 | 3/2004 |
| JP | 2007-242474 | 9/2007 |
| JP | 2008-118017 | 5/2008 |

OTHER PUBLICATIONS

Eto et al., U.S. Appl. No. 13/171,990, filed Jun. 29, 2011.

* cited by examiner

*Primary Examiner* — Minh D A
(74) *Attorney, Agent, or Firm* — Finnegan, Henderson, Farabow, Garrett & Dunner, L.L.P.

(57) ABSTRACT

According to one embodiment, a power supply control device of a plasma processing device having a plasma generation unit which generates plasma in a process chamber. The power supply control device includes a radio frequency power supply, a storage unit, and a matching circuit. The radio frequency power supply supplies a power to the plasma generation unit. The storage unit stores matching information including a first matching value, a second process condition, and a third matching value. The first matching value corresponds to process information of a first process condition. The second matching value corresponds to process information of a second process condition. The third matching value corresponds to process information of a transient state where the first process condition is being switched to the second process condition. The matching circuit matches impedances based on the matching information.

20 Claims, 12 Drawing Sheets

FIG.11
1100a → IN CASE OF FIG. 9
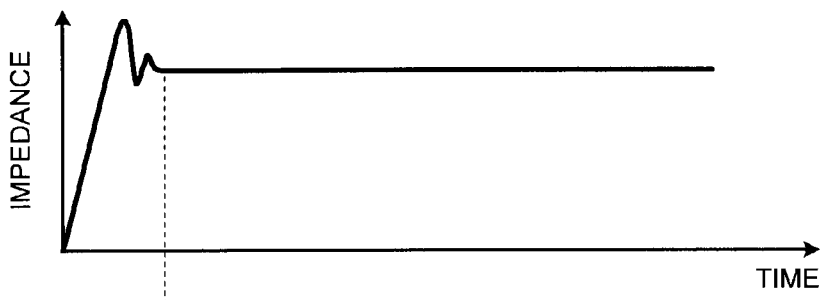
1100b → IN CASE OF TWO STEPS
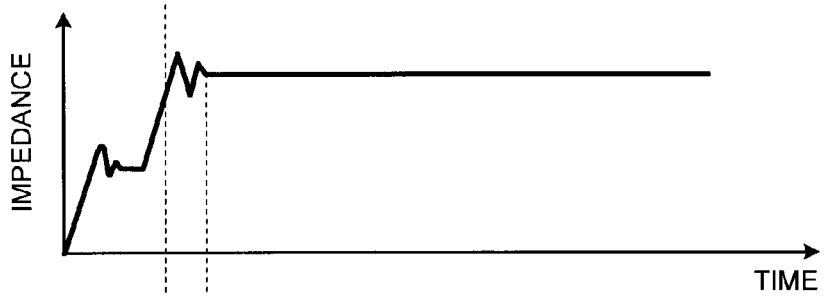
1100c → IN CASE OF FOUR STEPS
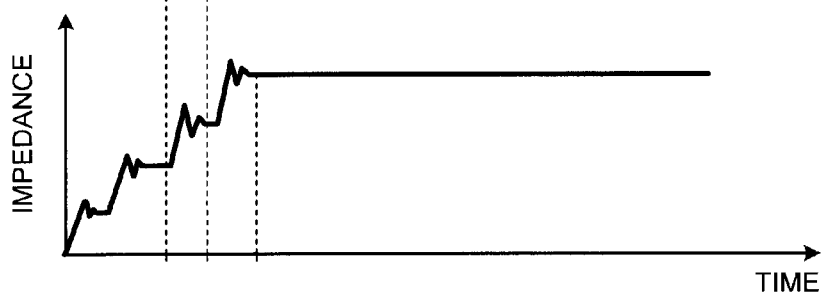
$T_{101}$
$T_{201}$
$T_{301}$

POWER SUPPLY CONTROL DEVICE, PLASMA PROCESSING DEVICE, AND PLASMA PROCESSING METHOD

CROSS-REFERENCE TO RELATED APPLICATIONS

This application is based upon and claims the benefit of priority from the prior Japanese Patent Application No. 2010-180433, filed on Aug. 11, 2010 and the prior Japanese Patent Application No. 2011-103631, filed on May 6, 2011; the entire contents of which are incorporated herein by reference.

FIELD

One embodiment relates generally to a power supply control device, a plasma processing device, and a plasma processing method.

BACKGROUND

Recently, in a semiconductor device manufacturing method, a case where a multilayer film is collectively processed for QTAT (Quick Turnaround Time) is increased. More particularly, in an etching process using plasma as in RIE (Reactive Ion Etching) process, a case where a multilayer film is collectively processed in a continuous process is increased. In the collective process of the multilayer film, a continuous process is performed by sequentially and continuously switching proper process conditions such as a gas flow rate, a pressure, a temperature, and a power for each layer to be processed while maintaining plasma discharge.

In the continuous process, since an impedance value of plasma is varied and a plasma state becomes unstable when the respective process conditions are switched, according to an ordinary method, a next process is performed after a matching circuit interposed between a power supply and a plasma processing device matches impedances to stabilize plasma. In the ordinary method, there is a tendency that a long time is consumed until the impedances are matched.

In contrast, there is also proposed a method of matching impedances using a matching value corresponding to process conditions before switching and a matching value corresponding to process conditions after switching. In this method, there is a tendency that since an impedance matching value is prone to be switched before a gas flow rate and a pressure are stabilized impedances are difficult to be matched and plasma can easily disappear, and even when impedances are matched a long time is necessary until plasma is stabilized. Accordingly, it is necessary to secure long time for switching an impedance after a gas flow rate and a pressure are stabilized.

BRIEF DESCRIPTION OF THE DRAWINGS

FIG. 11 is a view showing an impedance matching operation in an comparative example.

DETAILED DESCRIPTION

In general, according to one embodiment, there is provided a power supply control device of a plasma processing device having a plasma generation unit which generates plasma in a process chamber. The power supply control device includes a radio frequency power supply, a storage unit, and a matching circuit. The radio frequency power supply supplies a power to the plasma generation unit. The storage unit stores matching information including a first matching value, a second matching value, and a third matching value. The first matching value corresponds to process information of a first process condition. The second matching value corresponds to process information of a second process condition. The third matching value corresponds to process information of a transient state where the first process condition is being switched to the second process condition. The matching circuit matches impedances based on the matching information.

Plasma process devices according to embodiments will be explained below in detail referring to the accompanying drawings. Note that scope of the invention is by no means limited to the embodiments.

First Embodiment

Figure 1:
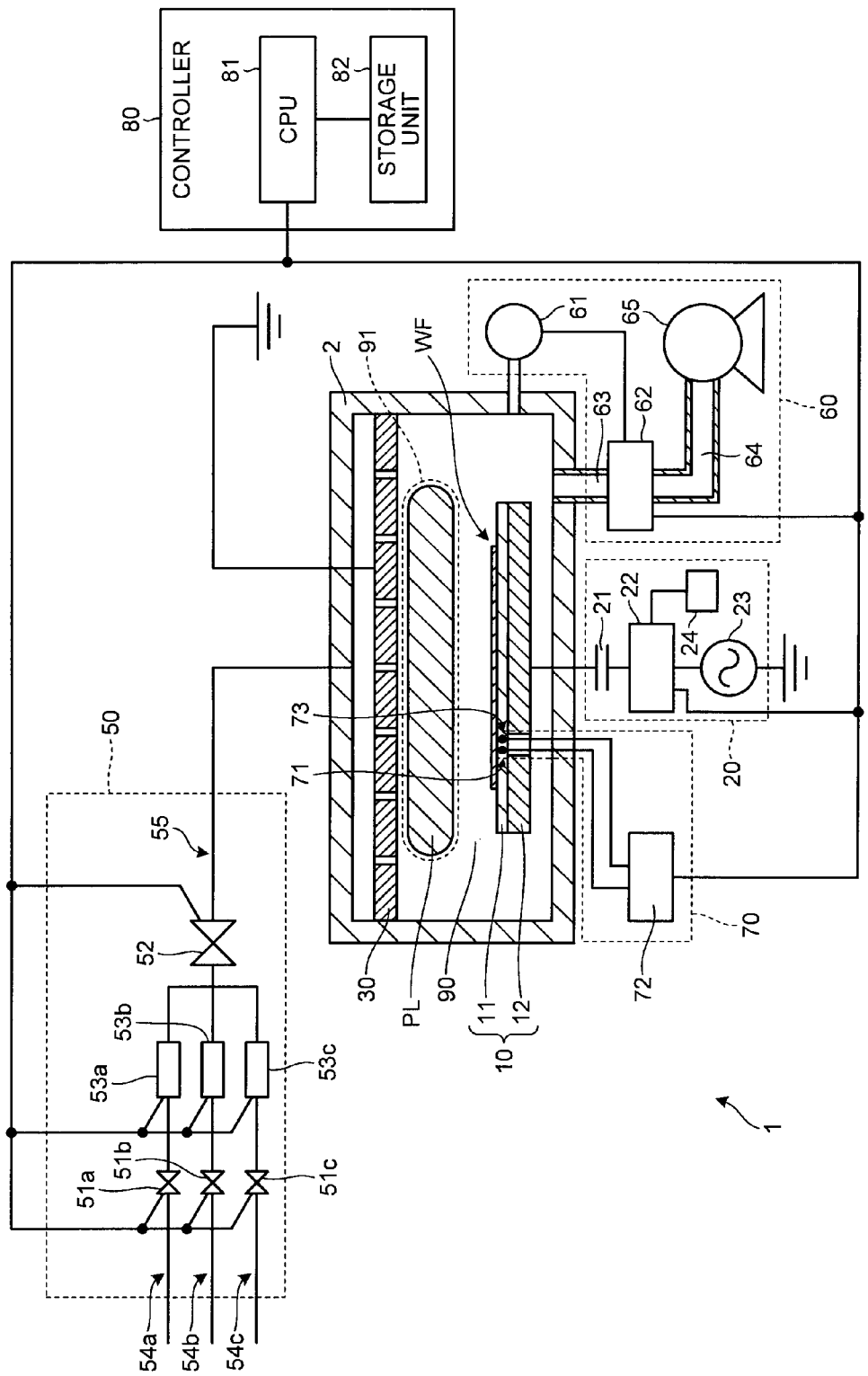
FIG. 1 is a view showing a configuration of a plasma processing device according to a first embodiment.

A plasma processing device 1 according to a first embodiment will be explained using FIG. 1. FIG. 1 is a view showing a schematic configuration of the plasma processing device 1 according to the first embodiment.

The plasma processing device 1 includes a process chamber 90, a lower electrode 10, a power supply control unit 20, an upper electrode 30, a gas supply control unit 50, an exhaust gas control unit 60, a temperature control unit 70, and a controller 80.

The process chamber 90 is a chamber in which plasma PL is generated and a space which is formed by a process vessel 2. The process vessel 2 is configured so that process gases can be supplied from the gas supply control unit 50 into the process chamber 90 as well as configured so that processed process gases can be exhausted from the process chamber 90 into the exhaust gas control unit 60.

The lower electrode 10 is disposed on a bottom surface side in the process chamber 90 so as to be insulated from the process vessel 2 via an insulation material (not shown). A substrate WF to be processed such as a silicon wafer and the like is placed on the lower electrode 10. The lower electrode 10 includes a temperature adjustment stage 11 and an electrode 12. The temperature adjustment stage 11 covers the electrode 12. A temperature of the temperature adjustment stage 11 is controlled by the temperature control unit 70. With the operation, the temperature control unit 70 controls a temperature of the substrate WF to be processed via the temperature adjustment stage 11. The electrode 12 is supplied with a power from the power supply control unit 20 and supplies the power up to the substrate WF to be processed via the temperature adjustment stage 11. The temperature adjustment stage 11 and the electrode 12 are formed of, for example, metal such as stainless steel, aluminum, and the like, respectively.

The power supply control unit 20 supplies a radio frequency power from a radio frequency power supply 23 to the lower electrode 10. The upper electrode 30 is, for example, grounded, and when the lower electrode 10 is supplied with a radio frequency voltage, the upper electrode 30 and the lower electrode 10 as a plasma generation unit which generates the plasma PL in the process chamber 90. That is, the plasma PL is generated in a space 91 between the upper electrode 30 and the lower electrode 10. At the time, a sheath region having a potential gradient is also formed between a plasma PL region and the lower electrode 10, and since ions (for example, F+, CF3+, and the like) generated in the plasma PL together with radicals are accelerated to a front surface of the substrate WF to be processed (the lower electrode 10 side), an anisotropic etching process is performed. An internal configuration of the power supply control unit 20 will be described later.

The gas supply control unit 50 controls the supply amounts of the respective process gases to the process chamber 90 (e.g. controls flow rates of the respective process gases supplied to the process chamber 90). Specifically, the gas supply control unit 50 includes individual gas feed pipes 54a to 54c, on-off valves 51a to 51c, flow rate controllers 53a to 53c, an on-off valve 52, and a gas feed pipe 55 for supplying a mixed gas. The individual gas feed pipes 54a, 54b, 54c are supplied with a process gas A, a process gas B, and a process gas C from gas cylinders (not shown), respectively. The on-off valves 51a to 51c are controlled by the controller 80, respectively. With the operation, the on-off valve 51a is opened at a predetermined timing so that the process gas A is supplied to the flow rate controller 53a. The on-off valve 51b is opened at a predetermined timing so that the process gas B is supplied to flow rate controller 53b. The on-off valve 51c is opened at a predetermined timing so that the process gas C is supplied to the flow rate controller 53c. The flow rate controllers 53a, 53b, and 53c are controlled by the controller 80 respectively and controls flow rates of the supplied process gases A, B, and C. That is, the on-off valve 52 is controlled by the controller 80 and opened at a predetermined timing so that a process gas supplied from at least any of the flow rate controllers 53a, 53b, and 53c is supplied into the process chamber 90 via the gas feed pipe 55 for supplying the mixed gas.

The exhaust gas control unit 60 controls a pressure of the process chamber 90 and discharge amounts of the process gases. Specifically, the exhaust gas control unit 60 includes a pressure sensor 61, an exhaust gas pipe 63, a pressure controller 62, an exhaust gas pipe 64, and a vacuum pump 65. The pressure sensor 61 detects a pressure in the process chamber 90 and supplies information of a value of the pressure to the pressure controller 62. The pressure controller 62 is connected to the process chamber 90 via the exhaust gas pipe 63 as well as connected to the vacuum pump 65 via the exhaust gas pipe 64. The pressure controller 62 includes an adjustment valve (not shown) capable of adjusting a valve travel and controls a valve travel of the adjustment valve so that a pressure in the process chamber 90 can become a target value in response to the value of the pressure supplied from the pressure sensor 61. With the operation, a pressure of the process chamber 90 and discharge amounts of the process gases can be controlled.

The temperature control unit 70 controls a temperature of the substrate WF to be processed via the temperature adjustment stage 11. Specifically, the temperature control unit 70 includes a temperature controller 72, and a temperature sensor 71 and a temperature adjuster (a heater or a cooler) 73 which are disposed in the temperature adjustment stage 11. The temperature sensor 71 detects a temperature of the substrate WF to be processed on the temperature adjustment stage 11. The temperature sensor 71 supplies the detected temperature information to the temperature controller 72. The temperature controller 72 controls the temperature adjuster 73 so that a temperature controlled by the controller 80 is achieved. With the operation, a temperature of the substrate WF to be processed is controlled via the temperature adjustment stage 11.

The controller 80 controls the respective units in the plasma processing device 1 in their entireties. Specifically, the controller 80 includes a CPU 81 and a storage unit 82. The storage unit 82 stores recipe information. The recipe information includes information of an order of process conditions and the contents of respective process conditions (a gas flow rate, a pressure, a temperature, a power, and the like) when a continuous process is performed while sequentially switching the process conditions. The CPU 81 controls the power supply control unit 20, the gas supply control unit 50, the exhaust gas control unit 60, and the temperature control unit 70 according to the respective process conditions of the recipe information stored in the storage unit 82. With the operation, the continuous process is performed.

Next, the internal configuration of the power supply control unit 20 will be explained using FIG. 1.

The power supply control unit 20 includes the radio frequency power supply 23, a storage unit 24, a matching circuit 22, and a blocking capacitor 21. The radio frequency power supply 23 generates a radio frequency power having, for example, a frequency of 13.56 MHz and the like. The storage unit 24 stores matching information to be used when the matching circuit 22 matches impedances. The matching information will be described later in detail. The matching circuit 22 includes, for example, variable capacitors C1, C2 and variable coils L1, L2 (refer to FIG. 2). The matching circuit 22 adjusts impedances (i.e. performs impedance matching) using the variable capacitors and the variable coils so that an impedance on the radio frequency power supply 23 side to the matching circuit 22 becomes equivalent to an impedance on the blocking capacitor 21 side to the matching circuit 22 referring to the matching information stored in the storage unit 24. The blocking capacitor 21 selectively supplies a radio frequency component of a radio frequency power supplied from the radio frequency power supply 23 to the lower electrode 10.

Figure 2:
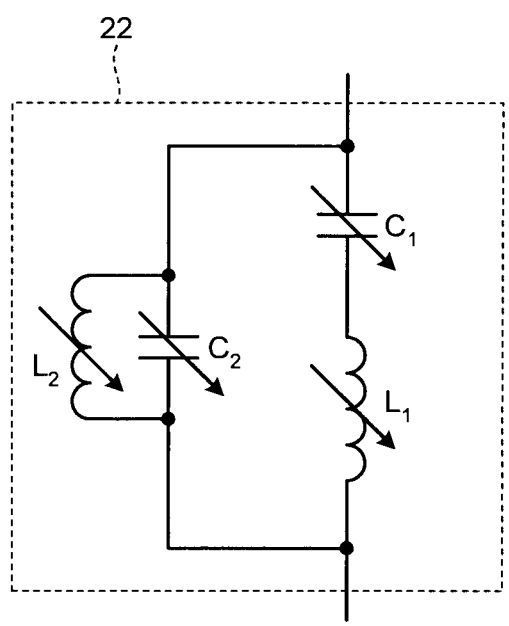
FIG. 2 is a view showing a matching circuit in the first embodiment.

Next, an internal configuration of the matching circuit 22 will be explained using FIG. 2. FIG. 2 is a view showing the internal configuration of the matching circuit 22 in the power supply control unit 20.

The matching circuit 22 includes, for example, the variable capacitors C1, C2 and the variable coils L1, L2. In the matching circuit 22, the variable capacitor C1 is connected in series to the variable coil L1 on, for example, a line having one end connected to the blocking capacitor 21 and the other end connected to the radio frequency power supply 23, and the variable capacitor C2 and the variable coil L2 are connected in parallel with them (the variable capacitor C1, the variable coil L1), respectively.

Further, the impedance matching by the matching circuit 22 is performed by adjusting respective values of the variable capacitors C1, C2 and the variable coils L1, L2 by a controller (not shown) and a driving unit (not shown) such as a servo motor and the like. The controller in the matching circuit 22 adjusts the values of the variable capacitors C1, C2 and the values of the variable coils L1, L2 by the driving unit such as the servo motor and the like referring to the matching information stored in the storage unit 24 (that is, the values of C1, C2 and L1, L2 to be used when impedances are matched).

Next, the matching information for matching impedances stored in the storage unit 24 will be explained using FIG. 3.

Matching information for matching impedances in switching includes the first matching value MV1 which matches an objective impedance to an impedance value I1 corresponding to process information in an initial state (the first process condition), the third matching value MV2 which matches an objective impedance to an impedance value I2 corresponding to process information in a halfway state (a transient state) where the initial state (the first process condition) is being switched to a process condition (the second process condition) using the process gas A, and the second matching value MV3 which matches an objective impedance to an impedance value I3 corresponding to process information in a stable state after the switching to the process condition (the second process condition) using the process gas A has been finished. Specifically, the first matching value MV1 is previously determined so as to match an objective impedance to the impedance value I1 corresponding to a flow rate F1 ($\approx$0) of the process gas A and a pressure P1 in the process chamber 90 before switching (the first process condition) (refer to graphs 301 to 303 of FIG. 3). The third matching value MV2 is previously determined so as to match an objective impedance to the impedance value I2 corresponding to a flow rate F2 of the process gas A and a pressure P2 in process chamber 90 in an halfway state (a transient state) where the initial state (the first process condition) is being switched to a process condition (the second process condition) using the process gas A. The second matching value MV3 is previously determined so as to match an objective impedance to the impedance value I3 corresponding to flow rate F3 of the process gas A and a pressure P3 in the process chamber 90 in the stable state after the switching to the process condition (the second process condition) using the process gas A has been finished.

Further, matching information for matching impedances in next switching includes the first matching value MV4 which matches an objective impedance to an impedance value I4 corresponding to process information in a process condition (the first process condition) using the process gas A, the third matching value MV5 which matches an objective impedance to an impedance value I5 corresponding to process information in a halfway state (a transient state) where the process condition (the first process condition) using the process gas A is being switched to a process condition (the second process condition) using a process gas B, and the second matching value MV6 which matches an objective impedance to an impedance value I6 corresponding to process information in a stable state after the switching to the process condition (the second process condition) using the process gas B has been finished. Specifically, the first matching value MV4 is previously determined so as to match an objective impedance to the impedance value I4 corresponding to a flow rate F41 of the process gas A, a flow rate F4 ($\approx$0) of the process gas B, and a pressure P4 in process chamber 90 before switching (the first process condition). The third matching value MV5 is previously determined so as to match an objective impedance to the impedance value I5 corresponding to a flow rate F51 of the process gas A, a flow rate F5 of the process gas B, and a pressure P5 in the process chamber 90 in a halfway state (a transient state) where the process condition (the first process condition) using the process gas A is being switched to the process condition (the second process condition) using the process gas B. The second matching value MV6 is previously determined so as to match an objective impedance to the impedance value I6 corresponding to a flow rate F61 of the process gas A, a flow rate F6 of the process gas B, and a pressure P6 in process chamber 90 in a stable state after the switching to the process condition (the second process condition) using the process gas B has been finished.

Next, a control method using the matching information (a plasma processing method) will be explained using FIG. 1 and FIG. 2.

First, matching information to be used when switching to the respective process conditions is performed is obtained and stored in the storage unit 24 of the power supply control unit 20. For example, a user previously determines experimentally matching information to be used when the switching to the respective process conditions is performed, and the user inputs the determined matching information to the power supply control unit 20 via an input interface (not shown) before a continuous process is performed. In response to the input, the power supply control unit 20 stores the input matching information in the storage unit 24.

Next, the controller 80 starts to switch the initial state (the first process condition) in the continuous process to the process condition (the second process condition) using the process gas A according to the recipe information. That is, the controller 80 provides the gas supply control unit 50, the exhaust gas control unit 60, the temperature control unit 70, and the like with a timing signal for starting the switch to start a control and simultaneously provides also the power supply control unit 20 with the timing signal for starting the switch.

When the timing signal for starting the switch from the initial state (the first process condition) to the process condition (the second process condition) using the process gas A is provided, the matching circuit 22 matches impedances so that the impedance I1 is achieved referring to the first matching value MV1 stored in the storage unit 24. Further, the matching circuit 22 starts to count a time by a timer (not shown).

Figure 3:
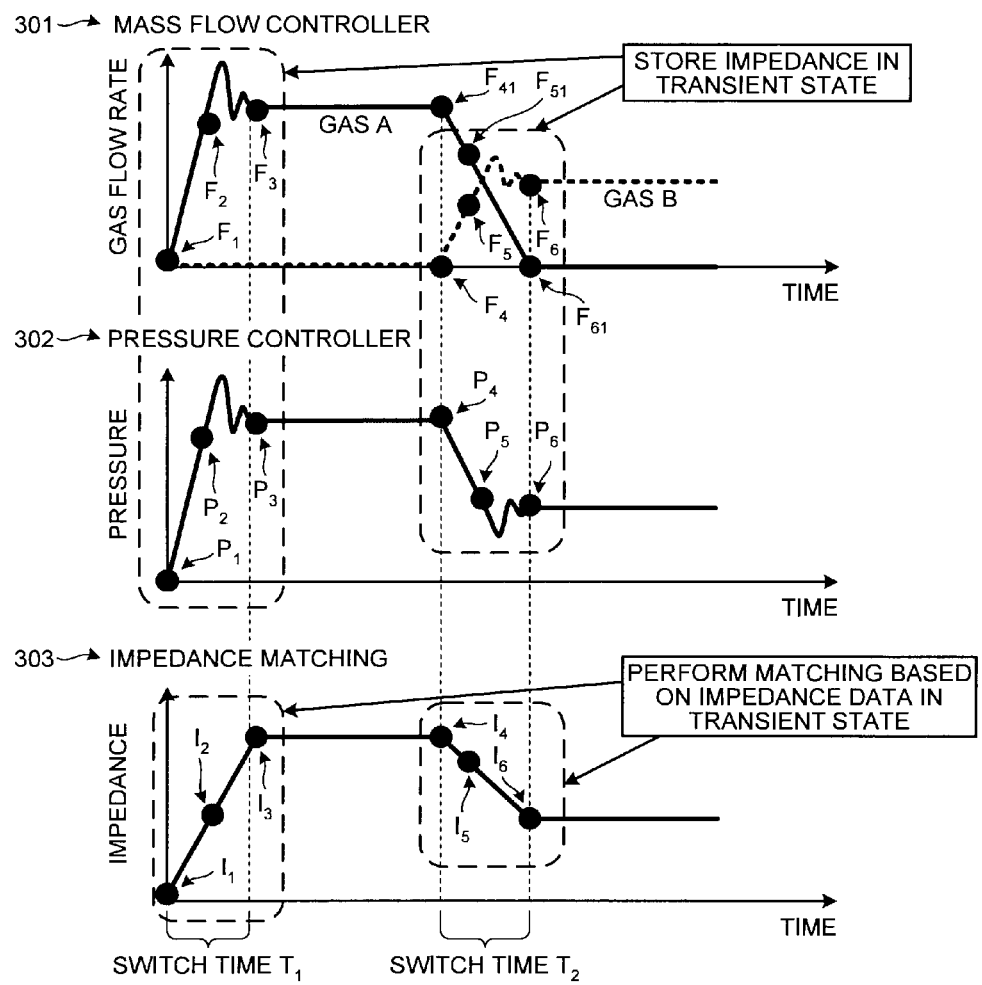
FIG. 3 is a view showing matching information in the first embodiment.

When a predetermined time has passed from the time at which the time starts to be counted by the timer and a timing (a timing of transient state) corresponding to the flow rate F2 and the pressure P2 shown in FIG. 3 is reached, the matching circuit 22 matches impedances so that the impedance I2 is achieved referring to the third matching value (a matching value of a transient state) MV2 stored in the storage unit 24.

When a predetermined time has further passed from the time at which the time starts to be counted by the timer (that is, a switch time T1 has passed from the switch start timing) and a timing corresponding to the flow rate F3 and the pressure P3 shown in FIG. 3 (a switch completion timing) is achieved, the matching circuit 22 matches impedances so that the impedance I2 is achieved referring to the second matching value MV3 stored in the storage unit 24.

Thereafter, when switching to a next process condition is performed, i.e., when the process condition (the first process condition) using the process gas A shown in FIG. 3 starts to be switched to the process condition (the second process condition) using the process gas B, the controller 80 provides the gas supply control unit 50, the exhaust gas control unit 60, and the temperature control unit 70 with a timing signal for starting the switch according to the recipe information to start a control in the second process condition and simultaneously provides also the power supply control unit 20 with the timing signal for starting the switch.

When the timing signal for starting the switch from the process condition (the first process condition) using the process gas A to the process condition (the second process condition) using the process gas B is provided, the matching circuit 22 matches impedances so that the impedance I4 is achieved referring to the first matching value MV4 from the matching information stored in the storage unit 24 at the time the process gas A is switched to the process gas B. Further, the matching circuit 22 starts to count a time by a timer (not shown).

When a predetermined time has passed from the time at which the time starts to be counted by the timer and a timing (a timing of transient state) corresponding to the flow rates F5, F51 and the pressure P5 shown in FIG. 3 is reached, the matching circuit 22 matches impedances so that the impedance I2 is achieved referring to the third matching value (a matching value of a transient state) MV5 stored in the storage unit 24.

When a predetermined time has further passed from the time at which the time starts to be counted by the timer (that is, a switch time T2 has passed from a switch start timing) and a timing (a switch completion timing) corresponding to the flow rates F6, F61 and the pressure P6 shown in FIG. 3 are reached, the matching circuit 22 matches impedances so that the impedance I2 is achieved referring to the second matching value MV6 stored in the storage unit 24.

Figure 9:
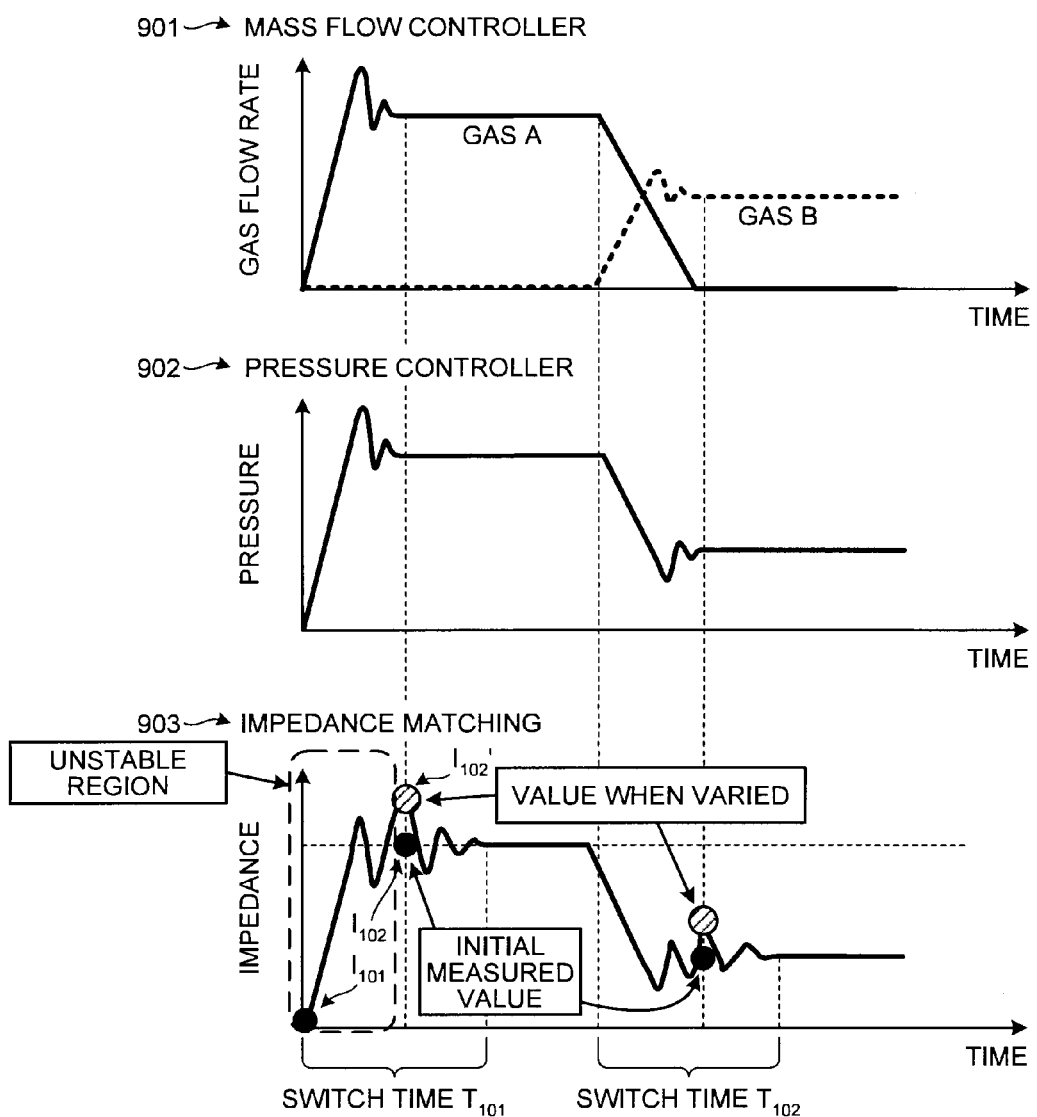
FIG. 9 is a view showing an impedance matching operation in a comparative example.

Here, a case will be tentatively examined in which when process conditions are switched in a continuous process as shown in FIG. 9, impedances are matched using a matching value MV101 which matches an objective impedance to an impedance value I101 corresponding to process information in a process condition before switching and a matching value MV102 which matches an objective impedance to an impedance value I102 corresponding to process information in a process condition after switching. In the case, since an impedance of the power supply control unit 20 becomes unstable while the switching is being performed, at a timing at which the planned switch time T1 (refer to the graph 303 of FIG. 3) has passed, there is a high possibility that an impedance I102' of the power supply control unit 20 has a value offset from an impedance I102 corresponding to the matching information stored in the storage unit 24 (refer to graphs 901 to 903 of FIG. 9). As a result, since a longer time is necessary for the matching to the impedance I102, there is a tendency that a time necessary until impedances are matched as well as plasma is stabilized, that is, a switch time T101 can become long.

In contrast, in the first embodiment, the storage unit 24 stores the matching information including the first matching value MV1 (which matches an objective impedance to the impedance value I1) corresponding to process information in the initial state (the first process condition), the third matching value MV2 (which matches an objective impedance to the impedance value I2) corresponding to process information in a halfway state (a transient state) where the initial state (the first process condition) is being switched to the process condition (the second process condition) using the process gas A, and the second matching value MV3 (which matches an objective impedance to the impedance value I3) corresponding to process information in the stable state after the switching to the process condition (the second process condition) using the process gas A has been finished. As a result, when the initial state (the first process condition) is switched to the process condition (the second process condition) using the process gas A, impedances can be sequentially matched to the first matching value MV1, the third matching value MV2, and the second matching value MV3.

That is, the matching circuit 22 sequentially matches impedances to the first matching value MV1 at the start timing of the switching from the initial state (the first process condition) to the process condition (the second process condition) using the process gas A, to the third matching value MV2 at the halfway (the transient state) timing of the switching, and to the second matching value MV3 at the completion timing of the switching, by referring to the matching information. With the operation, since a mismatched impedance can be reduced even at the halfway timing of the switching, impedances can be matched in the planned switch time T1 (see the graphs 301 to 303 of FIG. 3).

Further, the storage unit 24 stores the matching information including the first matching value MV4 which matches an objective impedance to the impedance value I4 corresponding to process information in the process condition (the first process condition) using the process gas A, the third matching value MV5 which matches an objective impedance to the impedance value I5 corresponding to process information in a halfway state (a transient state) where the process condition (the first process condition) using the process gas A is being switched to the process condition (the second process condition) using the process gas B (the transient state), and the second matching value MV6 which matches an objective impedance to the impedance value I6 corresponding to process information in the stable state after the switching to the process condition (the second process condition) using the process gas B has been finished. As a result, when the process condition (the first process condition) using the process gas A is switched to the process condition (the second process condition) using the process gas B, impedances can be sequentially matched to the first matching value MV4, the third matching value MV5, and the second matching value MV6.

That is, the matching circuit 22 sequentially matches impedances to the first matching value MV4 at the start timing of the switching from the process condition (the first process condition) using the process gas A to the process condition (the second process condition) using the process gas B, to the third matching value MV5 at the halfway (the transient state) timing of the switching, and to the second matching value MV6 at the completion timing of the switching, by referring to the matching information. With the operation, since a mismatched impedance can be reduced even at the halfway (the transient state) timing of the switching from the process condition (the first process condition) using the process gas A to the process condition (the second process condition) using the process gas B, impedances can be matched in the planned switch time T2 (see the graphs 301 to 303 of FIG. 3).

As described above, according to the first embodiment, there can be provided a plasma processing device which can be suitable to easily match impedances and to reduce a time necessary until plasma is stabilized (a switch time) when process conditions are switched in a continuous process.

Figure 10:
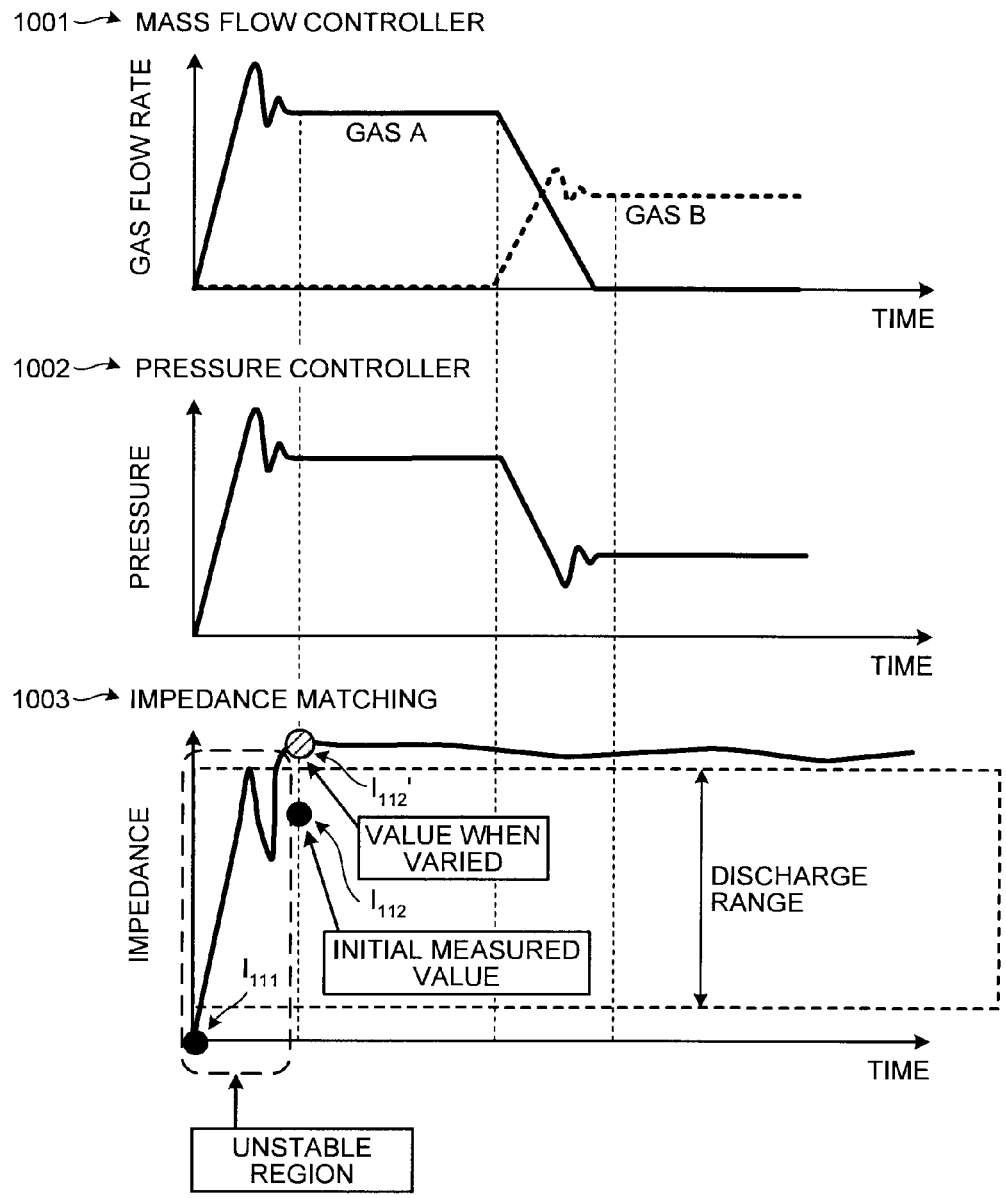
FIG. 10 is a view showing an impedance matching operation in a comparative example.

Otherwise, a case will be tentatively examined in which when process conditions are switched in a continuous process as shown in FIG. 10, impedances are matched using a matching value MV111 which matches an objective impedance to an impedance value I111 corresponding to process information in a process condition before switching and a matching value MV112 which matches an objective impedance to an impedance value I112 corresponding to process information in a process condition after switching. In the case shown in FIG. 10, there is a tendency that an impedance in a halfway state of the switching can become unstable as compared with the case shown in FIG. 9. Therefore, at the timing at which the planned switch time T1 (refer to graph 303 of FIG. 3) has passed, there is a possibility that the impedance I112' deviates from a discharge range where plasma discharge is possible (refer to graphs 1001 to 1003 of FIG. 10). As a result, there is a possibility that it becomes difficult to match impedances and there is also a possibility that plasma disappears.

In contrast, in the first embodiment, when the process conditions are switched in the continuous process, since an impedance variation of the power supply control unit 20 can be suppressed and plasma can be stabilized while the switching is being performed, impedances can be reliably matched.

Otherwise, a case will be tentatively examined in which when process conditions are switched in a continuous process as shown in FIG. 11, an impedance is stabilized by inserting a plurality of intermediate process conditions between a process condition before switching and a process condition after switching to reduce unstabilization of an impedance of the power supply control unit 20 in a halfway state of the switching. The respective intermediate process conditions are used to stabilize an impedance in the respective intermediate process conditions. That is, each intermediate process condition is a process condition in a stable state of the switching, and is different from a process condition in a transient state of the switching as in the embodiment. For example, as compared with a case of a graph 1100a of FIG. 11 (in a case of FIG. 9), in a case where a process condition is switched in two steps as in a graph 1100b of FIG. 11, a speed following to an impedance change (which corresponds to impedance change amount/time and corresponds to a slope of the graph 1100b of FIG. 11 when the graph rises) is similar to that of the graph 1100a of FIG. 11. However, a sum (a switch time T201) of a time necessary until plasma is stabilized after the initial state (the first process condition) is switched to the intermediate condition and a time necessary until plasma is stabilized after the intermediate condition is switched to the second process condition becomes longer than a time (a switch time T101) necessary until plasma is stabilized after the initial state (the first process condition) of the graph 1100a of FIG. 11 is switch to the second process condition. Further, since an etching process is force to be performed in unwanted process condition (the intermediate process condition), a processing accuracy is also deteriorated. When a process condition is switched in four steps as in a graph 1100c of FIG. 11, since a time (switch time T301) necessary until plasma is stabilized becomes longer and thus an etching process time in the unwanted process conditions (the intermediate process conditions) becomes longer, the processing accuracy is more deteriorated. Thus, there is a tendency that the more intermediate process conditions are inserted, the more a time necessary to match impedances to a target value after switching to the intermediate process conditions increase. There is also a tendency that the more intermediate process conditions are inserted, the worse the processing accuracy become. As a result, it becomes difficult to perform the continuous process according to the recipe information.

In contrast, in the first embodiment, when the process conditions are switched in the continuous process, since the impedance variation of the power supply control unit 20 can be suppressed in the halfway state where a process condition before switching is being switched to a process condition after switching, plasma can be stabilized. With the operation, a time necessary to match impedances as well as to stabilize plasma (switch time) can be reduced, and the continuous process according to the recipe information can be easily performed.

Further, in the first embodiment, in the matching information, the first matching value MV1 is previously (experimentally) determined so as to match an objective impedance to the impedance value I1 corresponding to the flow rate F1 of the process gas A and to the pressure P1 in the process chamber 90 before switching. The third matching value MV2 is previously (experimentally) determined so as to match an objective impedance to the impedance value I2 corresponding to the flow rate F2 of the process gas A and to the pressure P2 in the process chamber 90 in the halfway state (the transient state) where the switching is being performed. The second matching value MV3 is previously (experimentally) determined so as to match an objective impedance to the impedance value I3 corresponding to the flow rate F3 of the process gas A and to the pressure P3 in the process chamber 90 in the stable state after switching.

Further, in the matching information, the first matching value MV4 is previously (experimentally) determined so as to match an objective impedance to the impedance value I4 corresponding to the flow rate F41 of the process gas A, to the flow rate F4 ($\approx$0) of the process gas B, and to the pressure P4 in the process chamber 90 before switching. The third matching value MV5 is previously (experimentally) determined so as to match an objective impedance to the impedance value I5 corresponding to the flow rate F51 of the process gas A, to the flow rate F5 of the process gas B, and to the pressure P5 in the process chamber 90 in the halfway state (the transient state) where the switching is being performed. The second matching value MV6 is previously (experimentally) determined so as to match an objective impedance to the impedance value I6 corresponding to the flow rate F61 of the process gas A, to the flow rate F6 of the process gas B, and to the pressure P6 in the process chamber 90 in the stable state after switching.

Since impedances are matched referring to the matching information as above, the matching circuit 22 in the power supply control unit 20 can highly accurately match impedances in association with the gas supply control unit 50 and the exhaust gas control unit 60.

Note that the first matching value MV1, the third matching value MV2, and the second matching value MV3 may not correspond to a pressure in the process chamber and may correspond to flow rates of the process gases, respectively. Specifically, the first matching value MV1 may be a matching value which matches an objective impedance to the impedance value I1 corresponding to the flow rate F1 ($\approx$0) of the process gas A before switching (the first process condition). The third matching value MV2 may be a matching value which matches an objective impedance to the impedance value I2 corresponding to the flow rate F2 of the process gas A in the halfway state (the transient state) where the switching to the process condition (the second process condition) using the process gas A is being performed. The second matching value MV3 may be a matching value which matches an objective impedance to the impedance value I3 corresponding to the flow rate F3 of the process gas A in the stable state after the switching to the process condition (the second process condition) using the process gas A has been finished.

Otherwise, the first matching value MV1, the third matching value MV2, and the second matching value MV3 may not correspond to flow rates of the process gases and may correspond to a pressure of the process chamber, respectively. Specifically, the first matching value MV1 may be a matching value which matches an objective impedance to the impedance value I1 corresponding to the pressure P1 in the process chamber 90 before switching (the first process condition). The third matching value MV2 may be a matching value which matches an objective impedance to the impedance value I2 corresponding to the pressure P2 in the process chamber 90 in the halfway state (the transient state) where the switching to the process condition (the second process condition) using the process gas A is being performed (the transient state). The second matching value MV3 may be a matching value which matches an objective impedance to the impedance value I3 corresponding to the pressure P3 in the process chamber 90 in the stable state after the switching to the process condition (the second process condition) using the process gas A has been finished.

Second Embodiment

Next, a plasma processing device according to a second embodiment will be explained. Points different from the first embodiment will be mainly described below.

The second embodiment controls also flow rates of respective process gases, a pressure of a process chamber 90 and the like simultaneously in addition to an impedance when respective process conditions are switched. Therefore, in the plasma processing device 1 according to the second embodiment (refer to FIG. 1), a storage unit 82 in a controller 80 is previously stored with flow rate information of respective process gases, flow rate control information of the respective process gases, pressure information, and pressure control information, impedance information, impedance matching information, and the like.

Concerning the respective specific information stored the storage unit 82, the flow rate information and the flow rate control information of the respective process gases are stored as conditions for permitting the respective process gases to be stably switched when the process conditions are switched in such a manner that a user previously performs a continuous process experimentally based on the pressure information and the pressure control information. Specifically, the first flow rate control value FCV11 is previously determined so that a flow rate control can perform to a flow rate F11 corresponding to a pressure P11 in the process chamber 90 before switching (the first process condition) (refer to a graph 401 of FIG. 4). The third flow rate control value FCV12 is previously determined so that a flow rate control can perform to a flow rate F12 corresponding to a pressure P12 in the process chamber 90 in the halfway state (the transient state) where the switching to a process condition using a process gas A (the second process condition) is being performed (a transient state). The second flow rate control value FCV13 is previously determined so that a flow rate control can perform to a flow rate F13 corresponding to a pressure P13 in the process chamber 90 in a stable state after the switching to the process condition (the second process condition) using the process gas A has been finished.

The pressure information and the pressure control information are stored as conditions for permitting a pressure in the pressure process chamber 90 to be stably switched when the process conditions are switched in such a manner that a user previously performs a continuous process experimentally based on the pressure information and the pressure control information of the respective process gases. Specifically, the first pressure control value PCV11 is previously determined so that a pressure control can be performed to the pressure P11 corresponding to the flow rate F11 (≈0) of the process gas A before switching (the first process condition) (refer to a graph 402 of FIG. 4). The third pressure control value PCV12 is previously determined so that a pressure control can be performed to the pressure P12 corresponding to the flow rate F12 of the process gas A in the halfway state (the transient state) where the switching to the process condition (the second process condition) using the process gas A is being performed (the transient state). The second pressure control value PCV13 is previously determined so that a pressure control can be performed to the pressure P13 corresponding to the flow rate F13 of the process gas A in the stable state after the switching to the process condition (the second process condition) using the process gas A has been finished.

The impedance information and the matching information are stored as conditions for permitting an impedance of a power supply control unit 20 to be stably switched when the process conditions are switched in such a manner that the user previously performs a continuous process experimentally based on the flow rate information, the flow rate control information, the pressure information, and the pressure control information of the above respective process gases.

Next, a control method (a plasma processing method) using the matching information, the flow rate control information, and the pressure control information will be explained using FIG. 1 and FIG. 4.

First, the flow rate control information and the pressure control information to be used when switching to the respective process conditions is performed is obtained and stored in the storage unit 82 of the controller 80. For example, the user previously determines experimentally the flow rate control information and the pressure control information to be used when the switching to the respective process conditions is performed, and the user inputs the determined flow rate control information and pressure control information to the controller 80 via an input interface (not shown) before a continuous process is performed. In response to the input, the controller 80 stores the input flow rate control information and pressure control information in the storage unit 82.

Next, matching information, which corresponds to the flow rate control information and the pressure control information when the switching to the respective process conditions is performed, is obtained and stored in the storage unit 82 of the controller 80. For example, the user previously determines experimentally the matching information to be used when the switching to the respective process conditions is performed while controlling a flow rate of the process gas and a pressure of the process chamber to control values in response to the flow rate control information and the pressure control information, and the user inputs the determined matching information to the controller 80 via the input interface (not shown) before the continuous process is performed. In response to the input, the controller 80 stores the input matching information in the storage unit 82. Thus, in order to obtain the matching information, an experiment is performed in two steps, that is, the first preliminary experiment, which obtains the flow rate control information and the pressure control information, and the second preliminary experiment, which obtains the matching information using the flow rate control information and the pressure control information obtained in the first preliminary experiment, are performed.

Further, at a timing at which an initial state (the first process condition) starts to be switched to the process condition (the second process condition) using the process gas A, the controller 80 provides the power supply control unit 20 with an impedance I11 and the matching information (the first matching value MV11), provides the gas supply control unit 50 with the flow rate F11 (≈0) of the process gas A and the flow rate control information (the first flow rate control value FCV11), and provides the exhaust gas control unit 60 with the pressure P11 in the process chamber 90 and the pressure control information (the first pressure control value PCV11), from the storage unit 82. With the operation, the matching circuit 22 matches an impedance to the impedance value I11 based on the matching information (the first matching value MV11), the gas supply control unit 50 controls a flow rate of the process gas A to the flow rate F11 based on the flow rate control information (the first flow rate control value FCV11), and the exhaust gas control unit 60 controls a pressure in the process chamber 90 to the pressure P11 based on the pressure control information (the first pressure control value PCV11)

Figure 4:
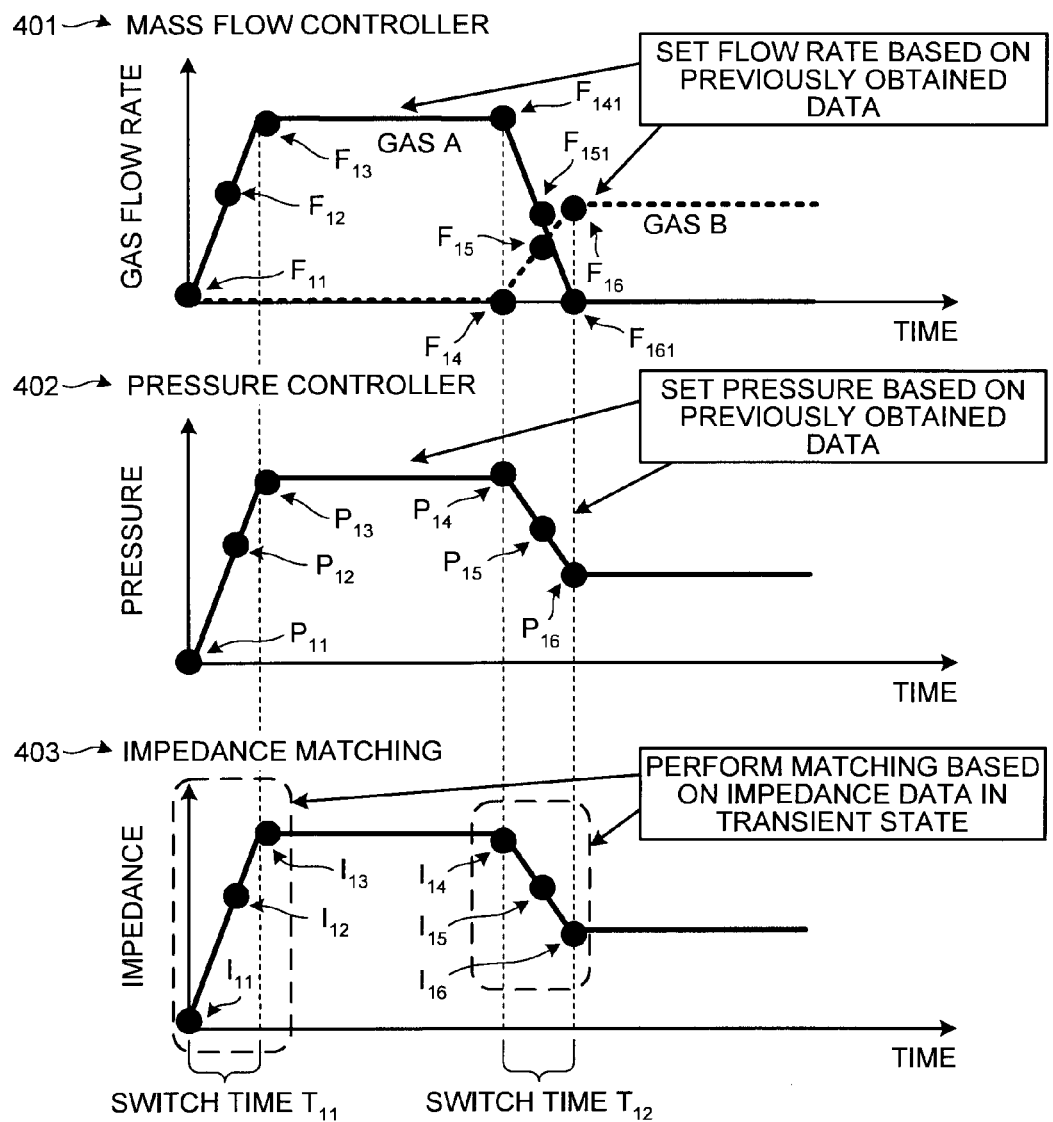
FIG. 4 is a view showing matching information in a second embodiment.

(refer to graphs 401 to 403 of FIG. 4). Further, the controller 80 starts to count a time by a timer (not shown).

When the controller 80 determines that the time from the switch start timing to a timing corresponding to the flow rate F12 and the pressure P12 shown in FIG. 4 (a timing of transient state) has passed referring to the timer, the controller 80 provides the power supply control unit 20 with an impedance I12 and the matching information (the third matching value MV12), provides the gas supply control unit 50 with the flow rate F12 of the process gas A and the flow rate control information (the third flow rate control value FCV12), and provides the exhaust gas control unit 60 with the pressure P12 in the process chamber 90 and the pressure control information (the third pressure control value PCV12), from the storage unit 82. With the operation, the matching circuit 22 matches an impedance to the impedance value I12 based on the matching information (the third matching value MV12), the gas supply control unit 50 controls a flow rate of the process gas A to the flow rate F12 based on the flow rate control information (the third flow rate control value FCV12) and the exhaust gas control unit 60 controls a pressure in the process chamber 90 to the pressure P12 based on the pressure control information (the third pressure control value PCV12).

Further, when the controller 80 determines that the time (a switch time T11) from the switch start timing to a timing (a switch completion timing) corresponding to the flow rate F13 and the pressure P13 shown in FIG. 4 has passed referring to the timer, the controller 80 provides the power supply control unit 20 with an impedance I13 and the matching information (the second matching value MV13), provides the gas supply control unit 50 with the flow rate F13 of the process gas A and the flow rate control information (the second flow rate control value FCV13), and provides the exhaust gas control unit 60 with the pressure P13 in the process chamber 90 and the pressure control information (the second pressure control value PCV13), from the storage unit 82. With the operation, the matching circuit 22 matches an impedance to the impedance value I13 based on the matching information (the second matching value MV13), the gas supply control unit 50 controls a flow rate of the process gas A to the flow rate F13 based on the flow rate control information (the second flow rate control value FCV13), and the exhaust gas control unit 60 controls a pressure in the process chamber 90 to the pressure P13 based on the pressure control information (the second pressure control value PCV13).

Thereafter, at a timing at which the process condition (the first process condition) using the process gas A starts to be switched to the process condition (the second process condition) using the process gas B, the controller 80 provides the power supply control unit 20 with an impedance I14 and the matching information (the first matching value MV14), provides the gas supply control unit 50 with a flow rate F141 of the process gas A, a flow rate F14 (≈0) of the process gas B, and the respective flow rate control information (the first flow rate control value FCV14), and provides the exhaust gas control unit 60 with the pressure P11 in the process chamber 90 and the pressure control information (the first pressure control value PCV14), from the storage unit 82. With the operation, the matching circuit 22 matches an impedance to an impedance value I14 based on the matching information (the first matching value MV14), the gas supply control unit 50 controls flow rates of the process gas A and the process gas B to flow rates F141, F14, respectively based on the flow rate control information (the first flow rate control value FCV14), and the exhaust gas control unit 60 controls a pressure in the process chamber 90 to a pressure P14 based on the pressure control information (the first pressure control value PCV14). Further, the controller 80 starts to count a time by the timer (not shown).

When the controller 80 determines that the time from the switch start timing to a timing corresponding to a flow rate F15 and a pressure P15 (the timing of transient state) shown in FIG. 4 has passed referring to the timer, the controller 80 provides the power supply control unit 20 with an impedance I15 and the matching information (the third matching value MV15), provides the gas supply control unit 50 with a flow rate F151 of the process gas A, a flow rate F15 of the process gas B, and the flow rate control information (the third flow rate control value FCV15), and provides the exhaust gas control unit 60 with the pressure P15 in the process chamber 90 and the pressure control information (the third pressure control value PCV15), from the storage unit 82. With the operation, the matching circuit 22 matches an impedance to the impedance value I15 based on the matching information (the third matching value MV15), the gas supply control unit 50 controls flow rates of the process gas A, the process gas B to the flow rates F151, F15, respectively based on the flow rate control information (the third flow rate control value FCV15), and the exhaust gas control unit 60 controls a pressure in the process chamber 90 to the pressure P15 based on the pressure control information (the third pressure control value PCV15).

Further, when the controller 80 determines that the time (a switch time T12) from the switch start timing to a timing corresponding to a flow rate F16 and a pressure P16 (a switch completion timing) shown in FIG. 4 has passed referring to the timer, the controller 80 provides the power supply control unit 20 with an impedance I16 and the matching information (the second matching value MV16), provides the gas supply control unit 50 with a flow rate F161 of the process gas A, a flow rate F16 of the process gas B and the flow rate control information (the second flow rate control value FCV16), and provides the exhaust gas control unit 60 with a pressure P16 in the process chamber 90 and the pressure control information (the second pressure control value PCV16), from the storage unit 82. With the operation, the matching circuit 22 matches an impedance to the impedance value I16 based on the matching information (the second matching value MV16), the gas supply control unit 50 controls flow rates of the process gas A, the process gas B to the flow rates F161, F16, respectively based on the flow rate control information (the second flow rate control value FCV16), and the exhaust gas control unit 60 controls a pressure in the process chamber 90 to the pressure P16 based on the pressure control information (the second pressure control value PCV16).

In the second embodiment, when the initial state (the first process condition) is switched to the process condition (the second process condition) using the process gas A, the controller 80 sequentially controls flow rates of the process gases to the flow rate F11 corresponding to the process information (for example, the pressure P11) in the process condition before switching, to the flow rate F12 corresponding to the process information (for example, the pressure P12) in the transient state of switching, and to the flow rate F13 corresponding to the process information (for example, the pressure P13) in the process condition after switching referring to the flow rate control information stored in the storage unit 82. Further, when the process condition (the first process condition) using the process gas A is switched to the process condition (the second process condition) using the process gas B, the controller 80 sequentially controls flow rates of the process gases to the flow rate F141 of the process gas A and the flow rate F14 of the process gas B corresponding to the process information (for example, the pressure P14) in the process condition before switching, to the flow rate F151 of the process gas A and the flow rate F15 of the process gas B corresponding to the process information (for example, the pressure P15) in the transient state of switching, and to the flow rate F161 of the process gas A and the flow rate F16 of the process gas B corresponding to the process information (for example, the pressure P16) in the process condition after switching, by referring to the flow rate control information. With the operation, a variation of flow rates of the respective process gases can be stabilized in the transient state in which the first process condition is switched to the second process condition.

Further, when the initial state (the first process condition) is switched to the process condition (the second process condition) using the process gas A, the controller 80 sequentially controls a pressure in the process chamber 90 to the pressure P11 corresponding to the process information (for example, the flow rate F11 of the process gas A) in the process condition before switching, to the pressure P12 corresponding to the process information (for example, the flow rate F12 of the process gas A) in the transient state of switching, and to the pressure P13 corresponding to the process information (for example, the flow rate F13 of the process gas A) in the process condition after switching, by referring to the pressure control information stored in the storage unit 82. Further, when the process condition (the first process condition) using the process gas A is switched to the process condition (the second process condition) using the process gas B, the controller 80 sequentially controls a pressure in the process chamber 90 to the pressure P14 corresponding to the process information (for example, the flow rate F141 of the process gas A, the flow rate F14 of the process gas B) in the process condition before switching, to the pressure P15 corresponding to the process information (for example, the flow rate F151 of the process gas A, the flow rate F15 of the process gas B) in the transient state of switching, and to the pressure P16 corresponding to the process information (for example, the flow rate F161 of the process gas A, the flow rate F16 of the process gas B) in the process condition after switching, by referring to the pressure control information. With the operation, a variation of a pressure in the process chamber 90 can be stabilized in the transient state in which the first process condition is switched to the second process condition.

As described above, according to the second embodiment, when the respective process conditions are switched in a continuous process, since the variation of the flow rates of the respective process gases and the variation of the pressure in the process chamber 90 can be stabilized in the transient state of switching, a variation of impedances in the transient state of switching can be easily stabilized. As a result, when process conditions are switched in the continuous process, impedances can be matched as well as a time necessary to stabilize plasma (a switch time) can be further reduced.

Note that the power supply control unit 20 may be configured to omit the storage unit 24. Even in the case, the controller 80 stores the matching information, and when the respective process conditions are switched in the continuous process, the controller 80 sequentially provides the power supply control unit 20 with matching values corresponding to the respective timings (before switching, the transient state of switching, and after switching). As a result, the matching circuit 22 can refer to the sequentially provided matching information (the matching values according to the respective timings).

Third Embodiment

Figure 5:
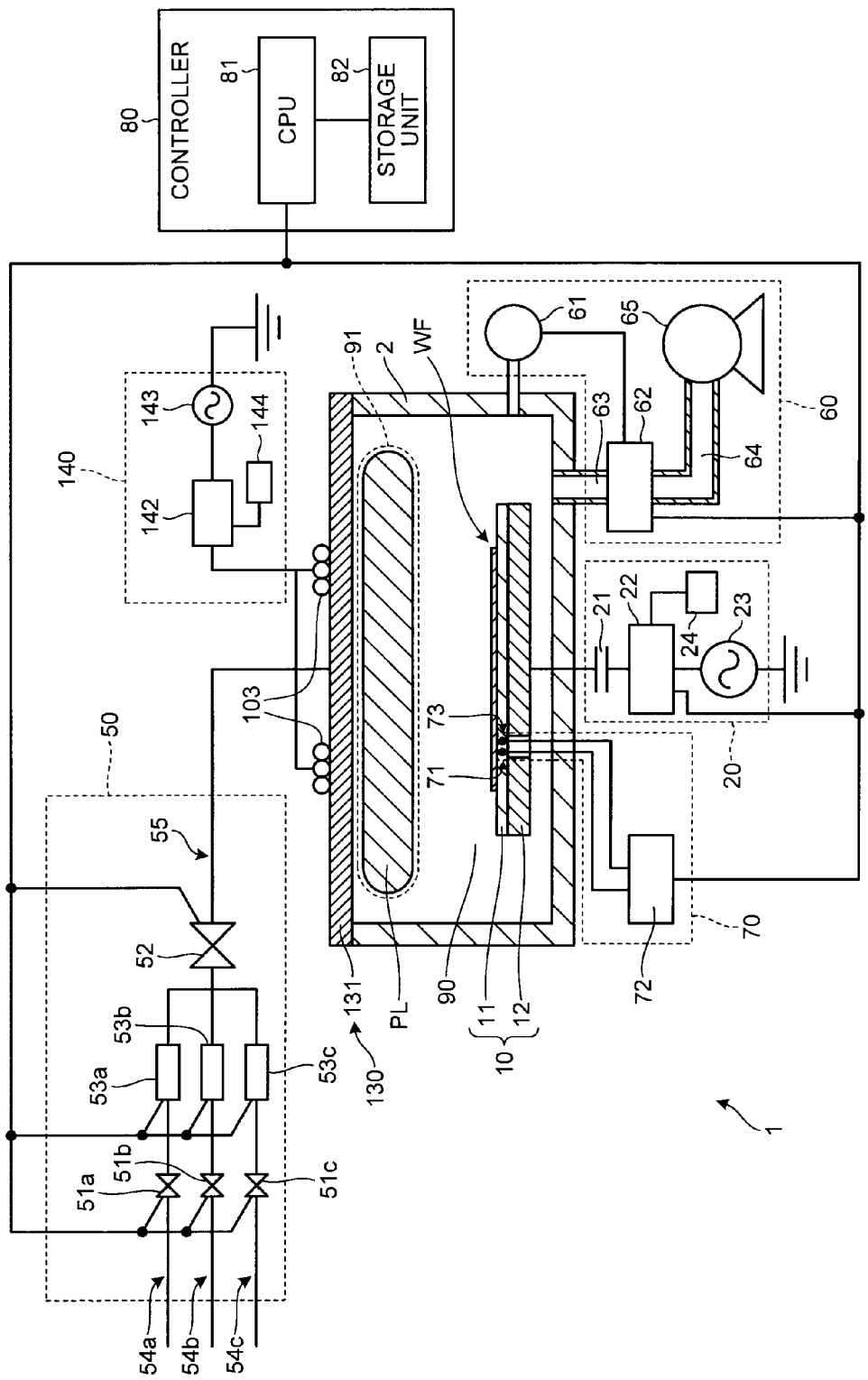
FIG. 5 is a view showing a configuration of a plasma processing device according to a third embodiment.

Next, a plasma processing device 1 according to the third embodiment will be explained using FIG. 5. FIG. 5 is a schematic view showing a schematic configuration of the plasma processing device 1 according to the third embodiment. Points different from the first embodiment will be mainly described below.

The plasma processing device 1 according to the third embodiment includes a plasma generation unit 130 and a power supply control unit 140. The plasma generation unit 130 includes antenna coils 103 and a dielectric wall 131. The power supply control unit 140 includes a radio frequency power supply 143, a storage unit 144, and a matching circuit 142.

The radio frequency power supply 143 generates a radio frequency power and supplies the radio frequency power to the antenna coils 103. When impedances are matched in the power supply control unit 140, an electromagnetic wave passes through a dielectric wall 133 which acts also as an upper wall of a process vessel 2 and is introduced into a space 91 in a process chamber 90. In the space 91 in the process chamber 90, a process gas is discharged, plasma PL is created, and ions (for example, F+, CF3+, and the like) are created together with radicals from the process gas.

Note that, in the plasma processing device 1 according to the third embodiment, a lower electrode 10 functions as a bias application unit for applying a bias voltage to the plasma PL generated by the plasma generation unit 130 in the process chamber 90. That is, a radio frequency power supply 23 generates a radio frequency power and supplies the radio frequency power to the electrode 10. The radio frequency power is a power for accelerating ions (for example, F+, CF3+, and the like), which are created from the process gas together with the radicals when the plasma PL is generated in the process chamber 90, to the electrode 10 side (a substrate WF to be processed side). The radio frequency power has a frequency of, for example, 13.56 MHz. As a result, the electrode 10 is charged negatively in a state that the plasma PL is charged positively, and ions (F+, CF3+, and the like) are accelerated to the electrode 10 side (the substrate WF to be processed side) by a potential difference therebetween, i.e., by the bias voltage.

The storage unit 144 stores matching information including matching values which are matched by the matching circuit 142. A detail of the matching information is similar to the matching information stored in a storage unit 24 of a power supply control unit 20.

The matching circuit 142 includes, for example, variable capacitors C1, C2 and variable coils L1, L2 (refer to FIG. 2). The matching circuit 142 adjusts impedances (impedance matching) using the variable capacitors and the variable coils so that an impedance on the radio frequency power supply 143 side to the matching circuit 142 becomes equivalent to an impedance on a blocking capacitor 141 side to the matching circuit 142, by referring to the matching information stored in the storage unit 144.

In third embodiment, when process conditions are switched in a continuous process, since an impedance of the power supply control unit 140 can be easily stabilized in addition to that an impedance of the power supply control unit 20 can be easily stabilized, a time necessary to match impedances (a switch time) in both the power supply control unit 20 and the power supply control unit 140 can be reduced.

Note that although the first embodiment and the second embodiment exemplarily explain a case where the plasma processing device 1 is a parallel flat type RIE device and the third embodiment exemplarily explains a case where the plasma processing device 1 is an ICP (Inductive Coupling Plasma) type RIE device, variations are not limited to the devices as long as a system or method of power supply control is similar. For example, in the third embodiment, the plasma processing device 1 may be an ECR (Electron Cyclotron Resonance) type RIE device, or may be an RIE device of a type by which plasmas are created in the plasma processing device 1, and the like.

Note that, in the first to third embodiments, matching information to be used when a process condition is switched may be further associated with a temperature of a substrate WF to be processed via a temperature adjustment stage 11. In the case, when an initial state is switched to a process condition using a process gas A, the first matching value is previously determined so as to match an objective impedance to an impedance I1 including a temperature state of the temperature adjustment stage 11 in the initial state, the third matching value (a matching value of a transient state) is previously determined so as to match an objective impedance to an impedance I2 including a temperature state of the temperature adjustment stage 11 in the halfway state (the transient state) where the switching is being performed, and the second matching value is previously determined so as to match an objective impedance to an impedance I3 including a temperature state of the temperature adjustment stage 11 after switching.

Further, when the process condition using the process gas A is switched to a process condition using a process gas B, in the matching information to be used when the process gas A is switched to the process gas B, the first matching value is previously determined so as to match an objective impedance to an impedance I4 including a temperature state of the temperature adjustment stage 11 before switching, the third matching value (the matching value of the transient state) is previously determined so as to match an objective impedance to an impedance I5 including a temperature state of the temperature adjustment stage 11 in the halfway state (the transient state) where the switching is being performed, and the second matching value is previously determined so as to match an objective impedance to an impedance I6 including a temperature state of the temperature adjustment stage 11 after switching.

When impedances are matched referring to the matching information, a matching circuit 22 in the power supply control unit 20 can perform a highly accurate impedance matching in association with a temperature control unit 70 in addition to a gas supply control unit 50 and an exhaust gas control unit 60.

Otherwise, in the first to third embodiments, the matching information to be used when process conditions are switched may be further associated with a power of the power supply control unit 20 (the radio frequency power supply 23) and a power of the power supply control unit 140 (the radio frequency power supply 143). In the case, when the initial state is switched to the process condition using the process gas A, the first matching value is previously determined so as to match an objective impedance to the impedance I1 including a power of the radio frequency power supply 23 or a power of the radio frequency power supply 143 in the initial state, the third matching value (the matching value of the transient state) is previously determined so as to match an objective impedance to the impedance I2 including a power of the radio frequency power supply 23 or the radio frequency power supply 143 in the halfway state (the transient state) where the switching is being performed, and the second matching value is previously determined so as to match an objective impedance to the impedance I3 including a power of the radio frequency power supply 23 or the radio frequency power supply 143 after switching.

Further, when the process condition using the process gas A is switched to the process condition using the process gas B, in the matching information to be used when the process gas A is switched to the process gas B, the first matching value is previously determined so as to match an objective impedance to the impedance I4 including a power of the radio frequency power supply 23 or the radio frequency power supply 143 before switching, the third matching value (the matching value of the transient state) is previously determined so as to match an objective impedance to the impedance I5 including a power of the radio frequency power supply 23 or the radio frequency power supply 143 in the halfway state (the transient state) where the switching is being performed, and the second matching value is previously determined so as to match an objective impedance to the impedance I6 including a power of the radio frequency power supply 23 or the radio frequency power supply 143 after switching.

When impedances are matched referring to the matching information, the matching circuit 22 in the power supply control unit 20 can perform a highly accurate impedance matching in association with the radio frequency power supply 23 in addition to the gas supply control unit 50 and the exhaust gas control unit 60. Further, the matching circuit 142 in the power supply control unit 14 can perform a highly accurate impedance matching in association with the radio frequency power supply 143 in addition to the gas supply control unit 50 and the exhaust gas control unit 60.

Fourth Embodiment

Next, a plasma processing device according to the fourth embodiment will be explained. Points different from the second embodiment will be mainly described below.

In the second embodiment, as a timing at which the process conditions starts to change, a timing at which flow rates of the process gases, a pressure in the process chamber 90, and an impedance start to change is used.

In contrast, in the fourth embodiment, attention is paid to a light emission intensity of a plasma PL in a process chamber 90, and, as a timing at which the process conditions starts to change, a timing at which the light emission intensity of the plasma PL starts to change in the process chamber 90 is used. Therefore, the contents of flow rate information of respective process gases, flow rate control information of the respective process gases, pressure information, pressure control information, and impedance information and impedance matching information respectively stored in a storage unit 282 of a controller 280 are different from the second embodiment.

Figure 7:
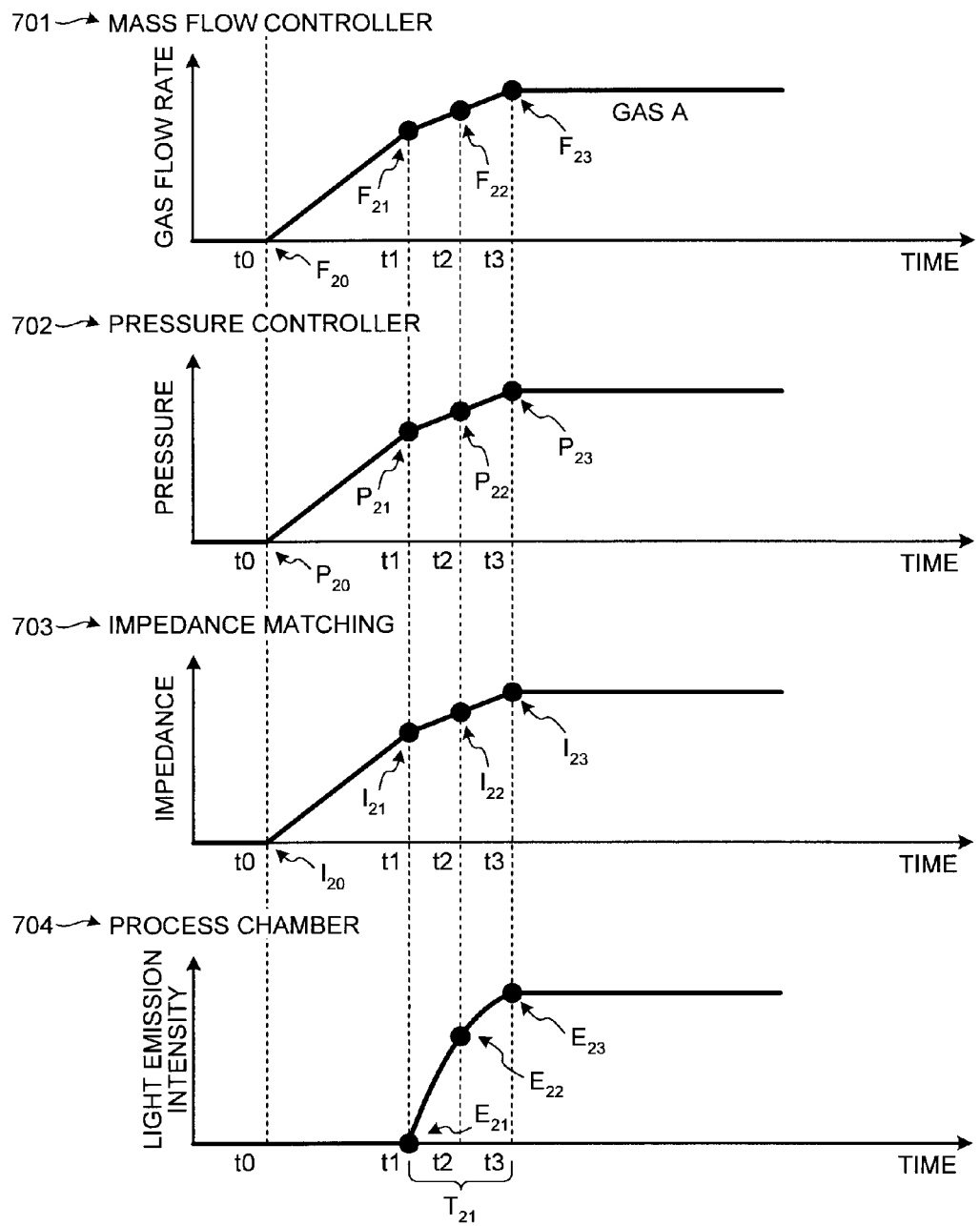
FIG. 7 is a view showing matching information in the fourth embodiment.

As shown in FIG. 7, matching information for matching impedances in switching includes the first matching value MV21 which matches an objective impedance to an impedance value I21 corresponding to a timing t1 of a light emission start state (the first light emission intensity) of the plasma PL, the third matching value MV22 which matches an objective impedance to an impedance value I22 corresponding to a light emission intensity at a timing t2 at which the light emission start state (the first light emission intensity) is being switched to a light emission stable state (second light emission intensity) using a process gas A (a transient state), and the second matching value MV23 which matches an objective impedance to an impedance value I23 corresponding to a light emission intensity at a timing t3 in a stable state after the switching to the light emission stable state using the process gas A (the second light emission intensity) has been finished. Specifically, the first matching value MV21 is previously determined so as to match an objective impedance to the impedance value I21 corresponding to a light emission intensity E21 (≈0) of the plasma PL in the process chamber 90, to a flow rate F21 of the process gas A, and to a pressure P21 in the process chamber 90 at the timing t1 before switching (the first light emission intensity) (refer to graphs 701 to 704 of FIG. 7). The third matching value MV22 is previously determined so as to match an objective impedance to the impedance value I22 corresponding to a light emission intensity E22 of the plasma PL in the process chamber 90, to a flow rate F22 of the process gas A, and to a pressure P22 in the process chamber 90 at the timing t2 in the halfway state (the transient state) where the switching to the light emission stable state (the second light emission intensity) using the process gas A is being performed (the transient state). The second matching value MV23 is previously determined so as to match an objective impedance to the impedance value I23 corresponding to a light emission intensity E23 of the plasma PL in the process chamber 90, to a flow rate F23 of the process gas A, and to a pressure P23 in the process chamber 90 at the timing t3 in the stable state after the switching to the light emission stable state (the second light emission intensity) using the process gas A has been finished.

Further, as shown in, for example, the graph 703 of FIG. 7, a change rate of impedance from a switch start timing (a light emission start state) to a switch completion timing (the light emission stable state using the process gas A) is lower than a change rate from a timing at which an impedance starts to change to the switch start timing (the light emission start state). For example, a temporal change rate of impedance ((I23−I21)/T21) from the impedance I21 at the timing t1 of the light emission start state to the impedance I23 at the timing t3 of the light emission stable state is lower than a temporal change rate of impedance ((I21−I20)/t1) from an impedance I20 at a timing t0 of an initial state to the impedance I21 at the timing t1 of the light emission start state.

Further, although not shown, matching information for matching impedances in next switching includes the first matching value MV24 which matches an objective impedance to an impedance value I24 corresponding to the light emission stable state using the process gas A, to the third matching value MV25 which matches an objective impedance to an impedance value I25 corresponding to a light emission intensity in a halfway state (a transient state) where the light emission stable state using the process gas A is being switched to a light emission stable state using a process gas B (the transient state), and to the second matching value MV26 which matches an objective impedance to an impedance value I26 corresponding to a light emission intensity in a stable state after the switching to the light emission stable state using the process gas B has been finished. Specifically, the first matching value MV24 is previously determined so as to match an objective impedance to the impedance value I24 corresponding to a light emission intensity E24 of the plasma PL in the process chamber 90, to a flow rate F241 of the process gas A, to a flow rate F24 of the process gas B, and to a pressure P24 in the process chamber 90 before switching. The third matching value MV25 is previously determined so as to match an objective impedance to the impedance value I25 corresponding to a light emission intensity E25 of the plasma PL in the process chamber 90, to a flow rate F251 of the process gas A, to a flow rate F25 of the process gas B, and to a pressure P25 in the process chamber 90 in the halfway state (the transient state) where the light emission stable state using the process gas A is being switched to the light emission stable state using the process gas B (the transient state). The second matching value MV26 is previously determined so as to match an objective impedance to the impedance value I26 corresponding to a light emission intensity E26 of the plasma PL in the process chamber 90, to a flow rate F261 of the process gas A, to a flow rate F26 of the process gas B, and to a pressure P26 in the process chamber 90 in the stable state after the switching to the light emission stable state using the process gas B has been finished.

As shown in FIG. 7, the flow rate information and the flow rate control information of the respective process gases are stored as conditions for permitting the respective process gases to be stably switched when the process conditions are switched in such a manner that a user previously performs a continuous process experimentally based on the pressure information and the pressure control information. Specifically, the first flow rate control value FCV21 is previously determined so that a flow rate control can be performed to the flow rate F21 corresponding to the light emission intensity E21 (≈0) of the plasma PL in the process chamber 90 and the pressure P21 in the process chamber 90 at the timing t1 before switching (the first light emission intensity). The third flow rate control value FCV22 is previously determined so that a flow rate control can be performed to the flow rate F22 corresponding to the light emission intensity E22 of the plasma PL in the process chamber 90 and the pressure P22 in the process chamber 90 at the timing t2 while the switching to the light emission stable state (the second light emission intensity) using the process gas A is being performed (transient state). The second flow rate control value FCV23 is previously determined so that a flow rate control can be performed to the flow rate F23 corresponding to the light emission intensity E23 of the plasma PL in the process chamber 90 and the pressure P23 in the process chamber 90 at the timing t3 of the stable state after the switching to the light emission stable state (the second light emission intensity) using the process gas A has been finished.

Further, as shown in, for example, the graph 701 of FIG. 7, a change rate of gas flow rate from the switch start timing (the light emission start state) to the switch completion timing (the light emission stable state using the process gas A) is lower than a change rate from a timing at which the gas flow rate starts to change to the switch start timing (the light emission start state). For example, a temporal change rate of gas flow rate from the gas flow rate F21 at the timing t1 of the light emission start state to the gas flow rate F23 at the timing t3 of the light emission stable state is lower than a temporal change rate of gas flow rate from a gas flow rate F20 at the timing t0 of the initial state to the gas flow rate F21 at the timing t1 of the light emission start state.

The pressure information and the pressure control information are stored as conditions for permitting the pressure in the process chamber 90 to be stably switched when the process conditions are switched in such a manner that the user previously performs a continuous process experimentally based on the flow rate information and the flow rate control information of the respective process gases. Specifically, the first pressure control value PCV21 is previously determined so that a pressure control can be performed to the pressure P21 corresponding to the light emission intensity E21 (≈0) of the plasma PL in the process chamber 90 and to the flow rate F21 of the process gas A at the timing t1 before switching (the first light emission intensity). The third pressure control value PCV22 is previously determined so that a pressure control can be performed to the pressure P22 corresponding to the light emission intensity E22 of the plasma PL in the process chamber 90 and to the flow rate F22 of the process gas A at the timing t2 in the halfway state (the transient state) where the switching to the light emission stable state (the second light emission intensity) using the process gas A is being performed. The second pressure control value PCV23 is previously determined so that a pressure control can be performed to the pressure P23 corresponding to the light emission intensity E23 of the plasma PL in the process chamber 90 and to the flow rate F23 of the process gas A at the timing t3 of the stable state after the switching to the light emission stable state (the second light emission intensity) using the process gas A has been finished.

Further, as shown in, for example, the graph 702 of FIG. 7, a change rate of pressure from the switch start timing (the light emission start state) to the switch completion timing (the light emission stable state using the process gas A) is lower than a change rate from a pressure change start timing to the switch start timing (the light emission start timing). For example, a temporal change rate of pressure from the pressure P21 at the timing t1 of the light emission start state to the pressure P23 at the timing t3 of the light emission stable state is lower than a temporal change rate of pressure from the pressure P20 at the timing t0 of the initial state to the pressure P21 at the timing t1 of the light emission start state.

Figure 6:
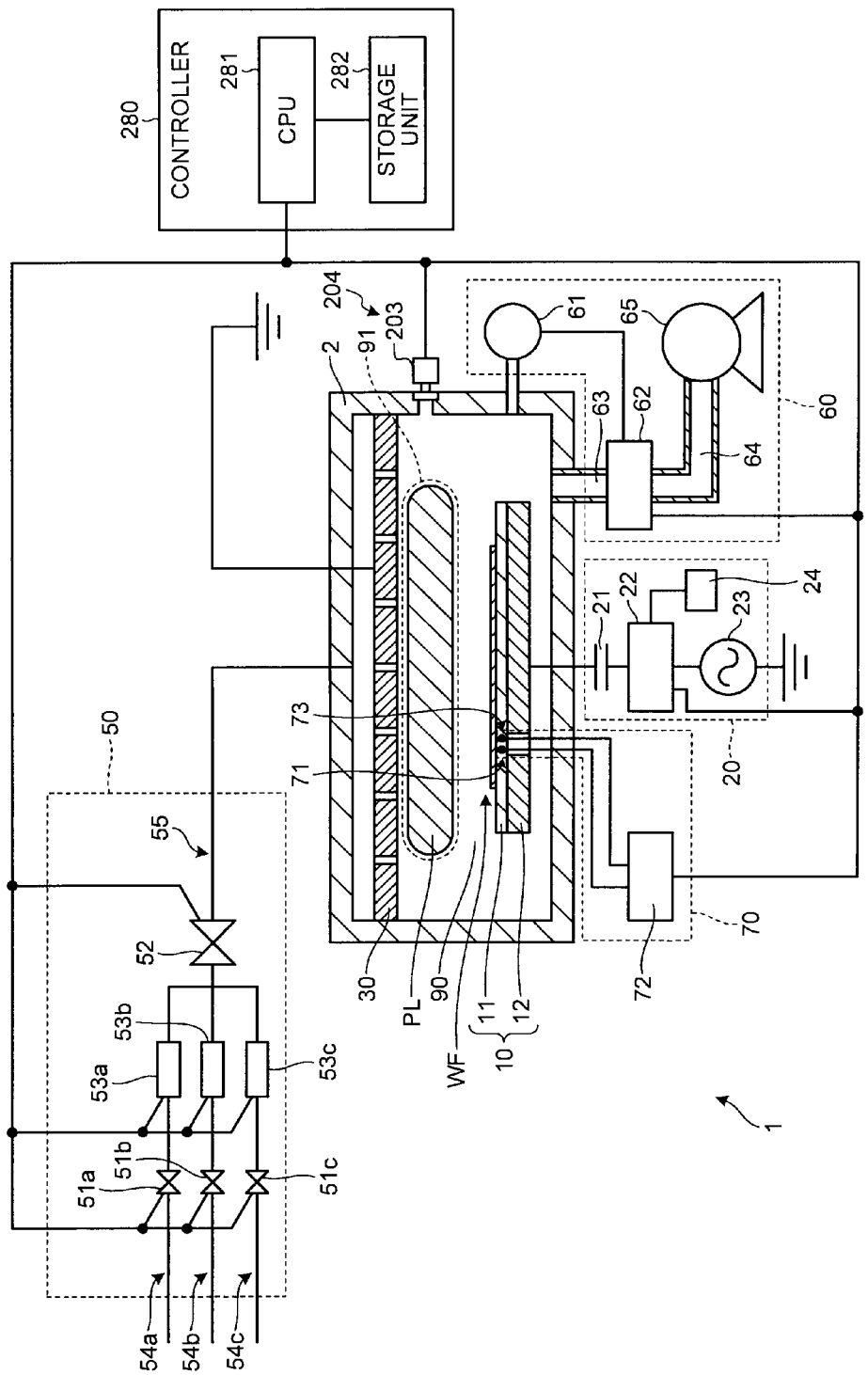
FIG. 6 is a view showing a configuration of a plasma processing device according to a fourth embodiment.

To previously experimentally obtain, as above, the matching information, the flow rate control information, and the pressure control information relating to the light emission intensity of the plasma PL in the process chamber 90, the plasma processing device 1 includes a detection unit 204 and a CPU (calculation unit) 281 as shown in FIG. 6.

The detection unit 204 detects a light emission intensity of the plasma PL generated in the process chamber 90. The detection unit 204 includes a spectrograph 203 installed at a position where the light emission intensity of the plasma PL in the process chamber 90 can be detected through, for example, a opened portion of a process vessel 2 and detects the light emission intensity of the plasma PL using the spectrograph 203. The detection unit 204 supplies the detected light emission intensity of the plasma PL to the CPU 281.

The CPU 281 calculates an impedance matching value, a flow rate control value, and a pressure control value so that the light emission intensity of the plasma detected by the detection unit 204 becomes a predetermined target value. For example, at the timing t1 of the light emission start state (the first light emission intensity), the CPU 281 calculates the first matching value MV21, the first flow rate control value FCV21, and the first pressure control value PCV21, respectively so that the light emission intensity of the plasma detected by the detection unit 204 becomes, for example, the plasma light emission intensity (the first plasma light emission intensity) E21 of the light emission start state. At the timing t2 of the transient state at which the light emission start state (the first light emission intensity) is being switched to the light emission stable state (the second light emission intensity) using the process gas A, the CPU 281 calculates the third matching value MV22, the third flow rate control value FCV22, and the third pressure control value PCV23, respectively so that the light emission intensity of the plasma detected by the detection unit 204 becomes, for example, the plasma light emission intensity E22 of the transient state. At the timing t3 of the stable state after the switching to the light emission stable state using the process gas A (the second light emission intensity) has been finished, the CPU 281 calculates the second matching value MV23, the second flow rate control value FCV23, and the second pressure control value PCV23, respectively so that the light emission intensity of the plasma detected by the detection unit 204 becomes, for example, the plasma light emission intensity E23 of the light emission stable state using the process gas A.

Figure 8:
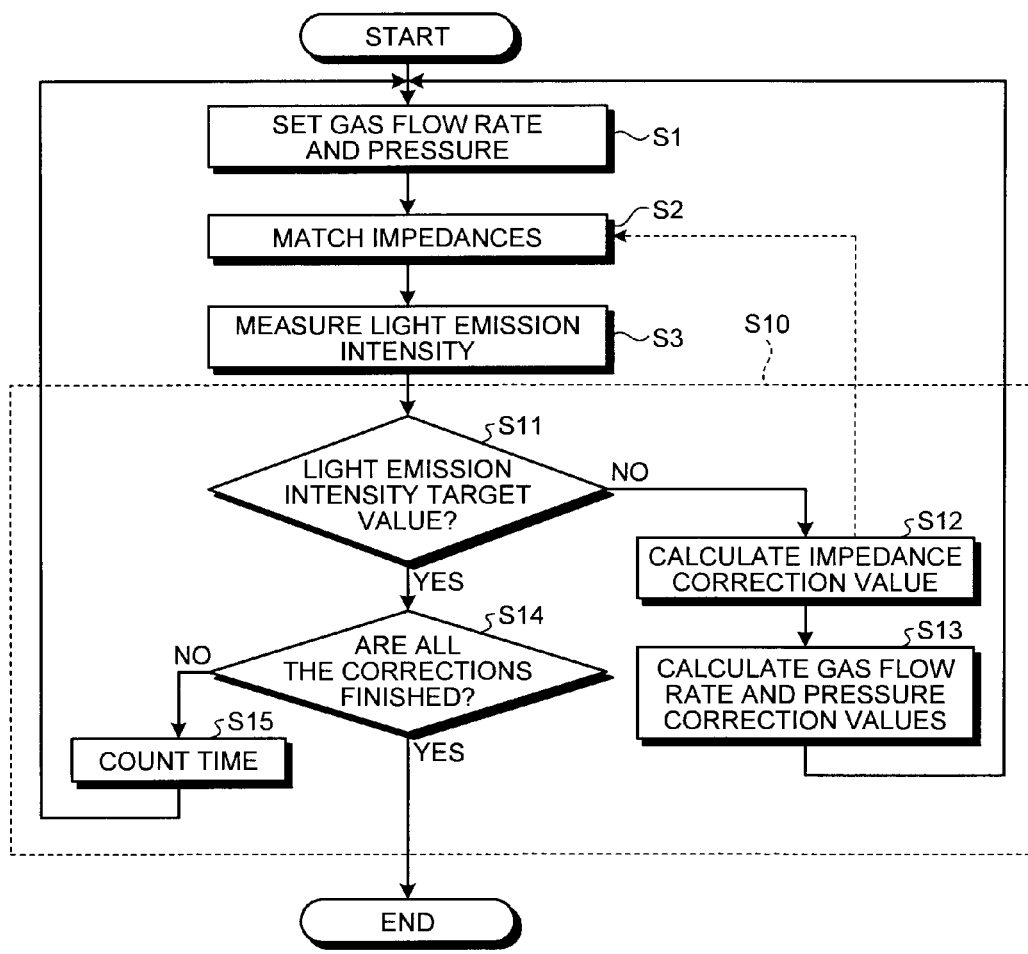
FIG. 8 is a flow chart showing a method of obtaining matching information in the fourth embodiment.

Next, an operation of the plasma processing device 1 when the matching information, the flow rate control information, and the pressure control information relating to the light emission intensity of the plasma PL in the process chamber 90 are previously obtained experimentally will be explained using FIG. 8. FIG. 8 is a flowchart showing the operation of the plasma processing device 1 when the matching information, the flow rate control information, and the pressure control information are previously obtained experimentally.

The method of previously obtaining experimentally the matching information, the flow rate control information, and the pressure control information relating to the light emission intensity of the plasma PL include two types of methods, for example. The first method is a method of verifying correction values (impedance matching values, flow rate control values, pressure control values) to plural timings in parallel (e.g. simultaneously) so that a target light emission intensity of plasma PL can be obtained. The second method is a method of sequentially verifying correction values to plural timings by performing verification at a timing and then performing next verification on the completion of the verification so that a target light emission intensity of the plasma PL can be obtained. The matching information, the flow rate control information, and the pressure control information may be previously obtained experimentally by any of the methods.

First, the first method will be explained. In the first method, processes at step S1 to step S13 are performed in parallel (e.g. simultaneously) as to predetermined timings. Note that when the first method is performed, step S14 and step S15 shown in FIG. 8 are not necessary, and when it is determined Yes at step S11, a process is finished. The first method will be specifically explained below.

At step S1, the CPU 281 sets flow rate control values and pressure control values at the respective predetermined timings to the flow rate control information and the pressure control information respectively and causes the storage unit 282 to store the flow rate control values and the pressure control values. Note that flow rate controllers 53a to 53c may set the flow rate control values at the respective predetermined timings to the flow rate control information and cause the storage unit 282 to store the flow rate control values in place of the CPU 281. Further, a pressure controller 62 may set the pressure control values at the respective predetermined timings to the pressure control information and cause the storage unit 282 to store the pressure control values in place of the CPU 281.

When, for example, the first process is performed, the CPU 281 sets default flow rate control values and default pressure control values at the respective predetermined timings to the flow rate control information and the pressure control information, respectively.

For example, the CPU 281 sets default flow rate control values FCV210, FCV220, FCV230 at a switch start timing t1', a transient state timing t2', and a switch completion timing t3' to the flow rate control information, respectively. Further, for example, the CPU 281 sets default pressure control values PCV210, PCV220, PCV230 at the switch start timing t1', the transient state timing t2', and the switch completion timing t3' to the pressure control information, respectively.

Note that although the switch start timing t1', the transient state timing t2', and the switch completion timing t3' are exemplified here as the respective predetermined timings, actually, an experiment is performed as to many timings including a timing between the timing t1' and the timing t2', a timing between the timing t2' and the timing t3', and the like. Further, the timing t1' is a candidate timing which can become the timing t1 shown in FIG. 7. The timing t2' is a candidate timing which can become the timing t2 shown in FIG. 7. The timing t3' is a candidate timing which can become the timing t3 shown in FIG. 7. This is similar also in the following explanation.

When second and subsequent processes are performed, the CPU 281 sets the flow rate control value and the pressure control value at the respective predetermined timings which are stored in the storage unit 282 to the flow rate control information and the pressure control information, respectively at step S13.

For example, the CPU 281 sets the flow rate control values FCV21, FCV22, FCV23 which are calculated at the switch start timing t1', the transient state timing t2', and the switch completion timing t3' stored in the storage unit 282 to the flow rate control information, respectively. Further, for example, the CPU 281 sets the pressure control values PCV21, PCV22, PCV23 calculated at the switch start timing t1', the transient state timing t2', and the switch completion timing t3' to the pressure control information, respectively.

The CPU 281 supplies the set flow rate control values and pressure control values to the flow rate controllers 53a to 53c and the pressure controller 62, respectively.

The flow rate controllers 53a to 53c control flow rates of the process gases according to the set flow rate control values. For example, the flow rate controllers 53a to 53c control the flow rates using the flow rate control values FCV21, FCV22, FCV23 so that flow rates of the process gas A supplied to the process chamber 90 become flow rates F21, F22, F23 at the switch start timing t1', the transient state timing t2', and the switch completion timing t3', respectively (refer to the graph 701 of FIG. 7).

The pressure controller 62 controls a pressure in the process chamber 90 according to the set pressure control values. For example, the pressure controller 62 controls the pressure using the pressure control values PCV21, PCV22, PCV23 so that a pressure in the process chamber 90 becomes pressures P21, P22, P23 at the switch start timing t1', the transient state timing t2', and the switch completion timing t3', respectively (refer to the graph 702 of FIG. 7).

At step S2, the CPU 281 sets impedance matching values at the respective predetermined timings to the matching information and causes the storage unit 282 to store the impedance matching values. Note that the matching circuit 22 may set the impedance matching values at the respective predetermined timings to the matching information in place of the CPU 281 and cause the storage unit 282 to store the impedance matching values in place of the CPU 281.

When, for example, the first process is performed, the CPU 281 set default impedance matching values to the matching information. For example, the CPU 281 sets default impedance matching values MV210, MV220, MV230 at the switch start timing t1', the transient state timing t2', and the switch completion timing t3' to the matching information, respectively.

When second and subsequent processes are performed, the CPU 281 sets the impedance matching values at the respective predetermined timings calculated at step S12 stored in the storage unit 282 to the matching information.

The CPU 281 supplies the set impedance matching values to the matching circuit 22. The matching circuit 22 matches impedances according the set impedance matching values.

At step S3, the detection unit 204 detects a light emission intensity of the plasma PL generated in the process chamber 90 at the respective predetermined timings (for example, the switch start timing t1', the transient state timing t2', and the switch completion timing t3'). The detection unit 204 supplies a result of the detection, i.e., signals showing the light emission intensities of the plasma PL detected at the respective predetermined timings to the CPU 281.

At step S10, the CPU 281 performs a calculation process so that the light emission intensities of the plasma detected by the detection unit 204 at the respective predetermined timings become target values at the respective predetermined timings. Specifically, the CPU 281 performs the following steps S11 to step S14.

At step S11, the CPU 281 compares the light emission intensities of the plasma PL detected by the detection unit 204 with the target values of the light emission intensities as to the respective predetermined timings (for example, the switch start timing t1', the transient state timing t2', and the switch completion timing t3') and whether or not the light emission intensities of the plasma PL agree with the target values (whether or not a difference therebetween is within a predetermined range).

For example, the CPU 281 compares the light emission intensity of the plasma PL detected by the detection unit 204 at the switch start timing t1' with the target value E21 of the light emission intensity at the switch start timing t1' and determines whether or not the light emission intensity of the plasma PL agrees with the target value E21 (whether or not a difference therebetween is within a predetermined range).

For example, the CPU 281 compares the light emission intensity of the plasma PL detected by the detection unit 204 at the transient state timing t2' with the target value E22 of the light emission intensity at the transient state timing t2' and determines whether or not the light emission intensity of the plasma PL agrees with the target value E22 (whether or not a difference therebetween is within a predetermined range).

For example, the CPU 281 compares the light emission intensity of the plasma PL detected by the detection unit 204 at the switch completion timing t3' with the target value E23 of the light emission intensity at the switch completion timing t3' and determines whether or not the light emission intensity of the plasma PL agrees with the target value E23 (a difference therebetween is within a predetermined range).

When a detected light emission intensity of the plasma PL agrees with a target value even at any timing, the CPU 281 finishes a process, whereas when a light emission intensity of the plasma PL detected at any timing does not agree with a target value, the CPU 281 moves a process to step S12.

At step S12, the CPU 281 corrects (changes) impedance matching values which are to be set at the respective predetermined timings. Note that, at the time, the respective predetermined timings (for example, the switch start timing t1', the transient state timing t2', and the switch completion timing t3') themselves may be changed together.

For example, when the light emission intensity of the plasma PL detected at the switch start timing t1' becomes larger than the target value, the CPU 281 calculates an impedance matching value (a correction value) at the switch start timing t1' so that the light emission intensity of the plasma PL at the switch start timing t1' becomes small. Otherwise, for example, when the light emission intensity of the plasma PL detected at the switch start timing t1' becomes smaller than the target value, the CPU 281 calculates an impedance matching value (a correction value) at the switch start timing t1' so that the light emission intensity of the plasma PL at the switch start timing t1' becomes large. Note that, at the time, the switch start timing t1' itself may be also changed.

For example, when the light emission intensity of the plasma PL detected at the transient state timing t2' becomes larger than the target value, the CPU 281 calculates an impedance matching value (a correction value) at the transient state timing t2' so that the light emission intensity of the plasma PL at the transient state timing t2' becomes small. Otherwise, for example, when the light emission intensity of the plasma PL detected at the transient state timing t2' becomes smaller than the target value, the CPU 281 calculates an impedance matching value (a correction value) at the transient state timing t2' so that the light emission intensity of the plasma PL at the transient state timing t2' becomes large. Note that, at the time, the switch start timing t2' itself may be also changed.

For example, when the light emission intensity of the plasma PL detected at the switch completion timing t3' becomes larger than the target value, the CPU 281 calculates an impedance matching value (a correction value) at the switch completion timing t3' so that the light emission intensity of the plasma PL at the switch completion timing t3' becomes small. Otherwise, for example, when the light emission intensity of the plasma PL detected at the switch completion timing t3' becomes smaller than the target value, the CPU 281 calculates an impedance matching value (a correction value) at the switch completion timing t3' so that the light emission intensity of the plasma PL at the switch completion timing t3' becomes large. Note that, at the time, the switch start timing t3' itself may be also changed.

At step S13, the CPU 281 corrects (changes) the flow rate control values and the pressure control values to be set.

For example, when the light emission intensity of the plasma PL detected at the switch start timing t1' becomes larger than the target value, the CPU 281 calculates a flow rate control value (a correction value) and a pressure control value (an correction value) at the switch start timing t1' so that the light emission intensity of the plasma PL at the switch start timing t1' becomes small. Otherwise, for example, when the light emission intensity of the plasma PL detected at the switch start timing t1' becomes smaller than the target value, the CPU 281 calculates a flow rate control value (a correction value) and a pressure control value (a correction value) at the switch start timing t1' so that the light emission intensity of the plasma PL at the switch start timing t1' becomes large.

For example, when the light emission intensity of the plasma PL detected at the transient state timing t2' becomes larger than the target value, the CPU 281 calculates a flow rate control value (a correction value) and a pressure control value (a correction value) at the transient state timing t2' so that the light emission intensity of the plasma PL at the transient state timing t2' becomes small. Otherwise, for example, when the light emission intensity of the plasma PL detected at the transient state timing t2' becomes smaller than the target value, the CPU 281 calculates a flow rate control value (a correction value) and a pressure control value (a correction value) at the transient state timing t2' so that the light emission intensity of the plasma PL at the transient state timing t2' becomes large.

For example, when the light emission intensity of the plasma PL detected at the switch completion timing t3' becomes larger than the target value, the CPU 281 calculates a flow rate control value (a correction value) and a pressure control value (a correction value) at the switch completion timing t3' so that the light emission intensity of the plasma PL at the switch completion timing t3' becomes small. Otherwise, for example, when the light emission intensity of the plasma PL detected at the switch completion timing t3' becomes smaller than the target value, the CPU 281 calculates a flow rate control value (a correction value) and a pressure control value (a correction value) at the switch completion timing t3' so that the light emission intensity of the plasma PL at the switch completion timing t3' becomes large.

Next, the second method will be explained. In the second method, a predetermined timing as an examination target is selected from predetermined timings, and processes at step S1 to step S13 are performed as to the selected predetermined timing. When the predetermined timing has been examined, i.e., when it is determined Yes at step S11, processes at step S14 and step S15 are performed, a next predetermined timing is selected as an examination target, and the processes at step S1 to step S13 are performed as to the next predetermined timing. Thus, the predetermined timings are sequentially selected and examined until it is determined Yes at step S14. Note that although the contents of the processes at step S1 to step S13 are similar to those described about the first method except that they are examined as to one predetermined timing, the second method is different from the first method in that processes at step S14 and step S15 shown in FIG. 8 are also performed.

At step S14, the CPU 281 determines whether or not light emission intensities of the plasma PL are sufficiently stabilized at all the predetermined timings (whether or not all the corrections have been finished).

Specifically, the CPU 281 continuously repeats similar processes to those at step S1 to step S3 for a predetermined period, plots waveforms of light emission intensities of the plasma PL, and determines whether or not the light emission intensities of the plasma PL are sufficiently stabilized for the predetermined period. When the light emission intensities of the plasma PL are sufficiently stabilized at all the predetermined timings to be examined, the CPU 281 finishes the process, whereas when the light emission intensities of the plasma PL are not sufficiently stabilized, the CPU 281 returns the process to step S1.

At step S15, the CPU 281 counts a time until next respective predetermined timings (for example, the switch start timing t1', the transient state timing t2', and the switch completion timing t3') to be examined.

Thus, a loop of step S1 to step S15 is repeatedly performed until the light emission intensities of the plasma detected by the detection unit 204 at the respective predetermined timings agree with target values and a temporal change waveform of the detected light emission intensities of the plasma is sufficiently stabilized (the waveform is not substantially overshot).

According to the first method or the second method, as shown in, for example, the graph 703 of FIG. 7, the change rate of impedance from the switch start timing (the light emission start state) to the switch completion timing (the light emission stable state using the process gas A) can be lower than the change rate from the timing at which an impedance starts to change to the switch start timing (the light emission start state). For example, a temporal change rate of impedance from the impedance I21 at the timing t1 of the light emission start state to the impedance I23 at the timing t3 of the light emission stable state can become lower than a temporal change rate of impedance from the impedance I20 at the timing t0 of the initial state to the impedance I21 at the timing t1 of the light emission start state.

Further, as shown in, for example, the graph 701 of FIG. 7, the change rate of gas flow rate from the switch start timing (the light emission start state) to the switch completion timing (the light emission stable state using the process gas A) can be lower than the change rate from the timing at which a gas flow rate starts to change to the switch start timing (the light emission start state). For example, a temporal change rate of gas flow rate from the gas flow rate F21 at the timing t1 of the light emission start state to the gas flow rate F23 at the timing t3 of the light emission stable state can become lower than a temporal change rate of gas flow rate from the gas flow rate F20 at the timing t0 of the initial state to the gas flow rate F21 at the timing t1 of the light emission start state.

Further, as shown in, for example, the graph 702 of FIG. 7, a change rate of pressure from the switch start timing (the light emission start state) to the switch completion timing (the light emission stable state using the process gas A) can be lower than a change rate from a pressure change start timing to the switch start timing (the light emission start state). For example, a temporal change rate of pressure from the pressure P21 at the timing t1 of the light emission start state to the pressure P23 at the timing t3 of the light emission stable state can become lower than a temporal change rate of pressure from the pressure P20 at the timing t0 of the initial state to the pressure P21 at the timing t1 of the light emission start state.

Next, a control method (a plasma processing method) using the matching information, the flow rate control information, and the pressure control information will be explained using FIG. 6 and FIG. 7.

First, the process shown in FIG. 8 is performed as described above, and the matching information, the flow rate control information, and the pressure control information are obtained and stored in the storage unit 282 of the controller 280.

At the switch start timing t1 from the light emission start state (the first light emission intensity) to the light emission stable state (the second light emission intensity) using the process gas A, the controller 280 provides the power supply control unit 20 with the impedance I21 and the matching information (the first matching value MV21), provides the gas supply control unit 50 with the flow rate F21 of the process gas A and the flow rate control information (the first flow rate control value FCV21), and provides the exhaust gas control unit 60 with the pressure P21 in the process chamber 90 and the pressure control information (the first pressure control value PCV21) from the storage unit 282. With the operation, the matching circuit 22 matches an impedance to the impedance value I21 based on the matching information (the first matching value MV21), the gas supply control unit 50 controls a flow rate of the process gas A to the flow rate F21 based on the flow rate control information (the first flow rate control value FCV21), and the exhaust gas control unit 60 controls a pressure in the process chamber 90 to the pressure P21 based on the pressure control information (the first pressure control value PCV21). Further, the controller 280 starts to count a time by the timer (not shown).

When the controller 280 determines referring to the timer that the time from the switch start timing t1 to the timing (the timing of transient state) t2 corresponding to the flow rate F22 and the pressure P22 shown in FIG. 7 has passed, the controller 280 provides the power supply control unit 20 with the impedance I22 and the matching information (the third matching value MV22), provides the gas supply control unit 50 with the flow rate F22 of the process gas A and the flow rate control information (the third flow rate control value FCV22), and provides the exhaust gas control unit 60 with the pressure P22 in the process chamber 90 and the pressure control information (the third pressure control value PCV22) from the storage unit 282. With the operation, the matching circuit 22 matches an impedance to the impedance value I22 based on the matching information (the third matching value MV22), the gas supply control unit 50 controls a flow rate of the process gas A to the flow rate F22 based on the flow rate control information (the third flow rate control value FCV22), and the exhaust gas control unit 60 controls a pressure in the process chamber 90 to the pressure P22 based on the pressure control information (the third pressure control value PCV22).

Further, when the controller 280 determines referring to the timer that the time (switch time T21) from the switch start timing t1 to the timing (the switch completion timing) t3 corresponding to the flow rate F23 and the pressure P23 shown in FIG. 7 has passed, the controller 280 provides the power supply control unit 20 with the impedance I23 and the matching information (the second matching value MV23), provides the gas supply control unit 50 with the flow rate F23 of the process gas A and the flow rate control information (the second flow rate control value FCV23), and provides the exhaust gas control unit 60 with the pressure P23 in the process chamber 90 and the pressure control information (the second pressure control value PCV23) from the storage unit 282. With the operation, the matching circuit 22 matches an impedance to the impedance value I23 based on the matching information (the second matching value MV23), the gas supply control unit 50 controls a flow rate of the process gas A to the flow rate F23 based on the flow rate control information (the second flow rate control value FCV23), and the exhaust gas control unit 60 controls a pressure in the process chamber 90 to the pressure P23 based on the pressure control information (the second pressure control value PCV23).

Thereafter, although not shown, at the timing at which the process condition (the first process condition) using the process gas A starts to be switched to the process condition (the second process condition) using the process gas B, the controller 80 provides the power supply control unit 20 with the impedance I24 and the matching information (the first matching value MV24), provides the gas supply control unit 50 with the flow rate F241 of the process gas A, the flow rate F24 of the process gas B, and the respective flow rate control information (the first flow rate control value FCV24), and provides the exhaust gas control unit 60 with the pressure P24 in the process chamber 90 and the pressure control information (the first pressure control value PCV24), from the storage unit 282. With the operation, the matching circuit 22 matches an impedance to the impedance value I24 based on the matching information (the first matching value MV24), the gas supply control unit 50 controls flow rates of the process gas A, the process gas B to the flow rate F241, the flow rate F24, respectively based on the flow rate control information (the first flow rate control value FCV24), and the exhaust gas control unit 60 controls a pressure in the process chamber 90 to the pressure P24 based on the pressure control information (the first pressure control value PCV24). Further, the controller 280 starts to count a time by the timer (not shown).

Although not shown, when the controller 280 determines referring to the timer that the time from the switch start timing to the timing (the timing of transient state) corresponding to the flow rate F25 and the pressure P25 has passed, the controller 280 provides the power supply control unit 20 with the impedance I25 and the matching information (the third matching value MV25), provides the gas supply control unit 50 with the flow rate F251 of the process gas A and the flow rate F25 of the process gas B, and the flow rate control information (the third flow rate control value FCV25), and provides the exhaust gas control unit 60 with the pressure P25 in the process chamber 90 and the pressure control information (the third pressure control value PCV25), from the storage unit 282. With the operation, the matching circuit 22 matches an impedance to the impedance value I25 based on the matching information (the third matching value MV25), the gas supply control unit 50 controls flow rates of the process gas A and the process gas B to the flow rate F251 and the flow rate F25, respectively based on the flow rate control information (the third flow rate control value FCV25), and the exhaust gas control unit 60 controls a pressure in the process chamber 90 to the pressure P25 based on the pressure control information (the third pressure control value PCV25).

Further, although not shown, when the controller 280 determines referring to the timer that the time (the switch time T22) from the switch start timing to the timing (the switch completion timing) corresponding to the flow rate F26 and the pressure P26 has passed, the controller 280 provides the power supply control unit 20 with the impedance I26 and the matching information (the second matching value MV26), provides the gas supply control unit 50 with the flow rate F261 of the process gas A, the flow rate F26 of the process gas B, and the flow rate control information (the second flow rate control value FCV26), and provides the exhaust gas control unit 60 with the pressure P26 in the process chamber 90 and the pressure control information (the second pressure control value PCV26), from the storage unit 282. With the operation, the matching circuit 22 matches an impedance to the impedance value I26 based on the matching information (the second matching value MV26), the gas supply control unit 50 controls flow rates of the process gas A and the process gas B to the flow rate F261 and the flow rate F26, respectively based on the flow rate control information (the second flow rate control value FCV26), and the exhaust gas control unit 60 controls a pressure in the process chamber 90 to the pressure P26 based on the pressure control information (the second pressure control value PCV26).

Figure 12:
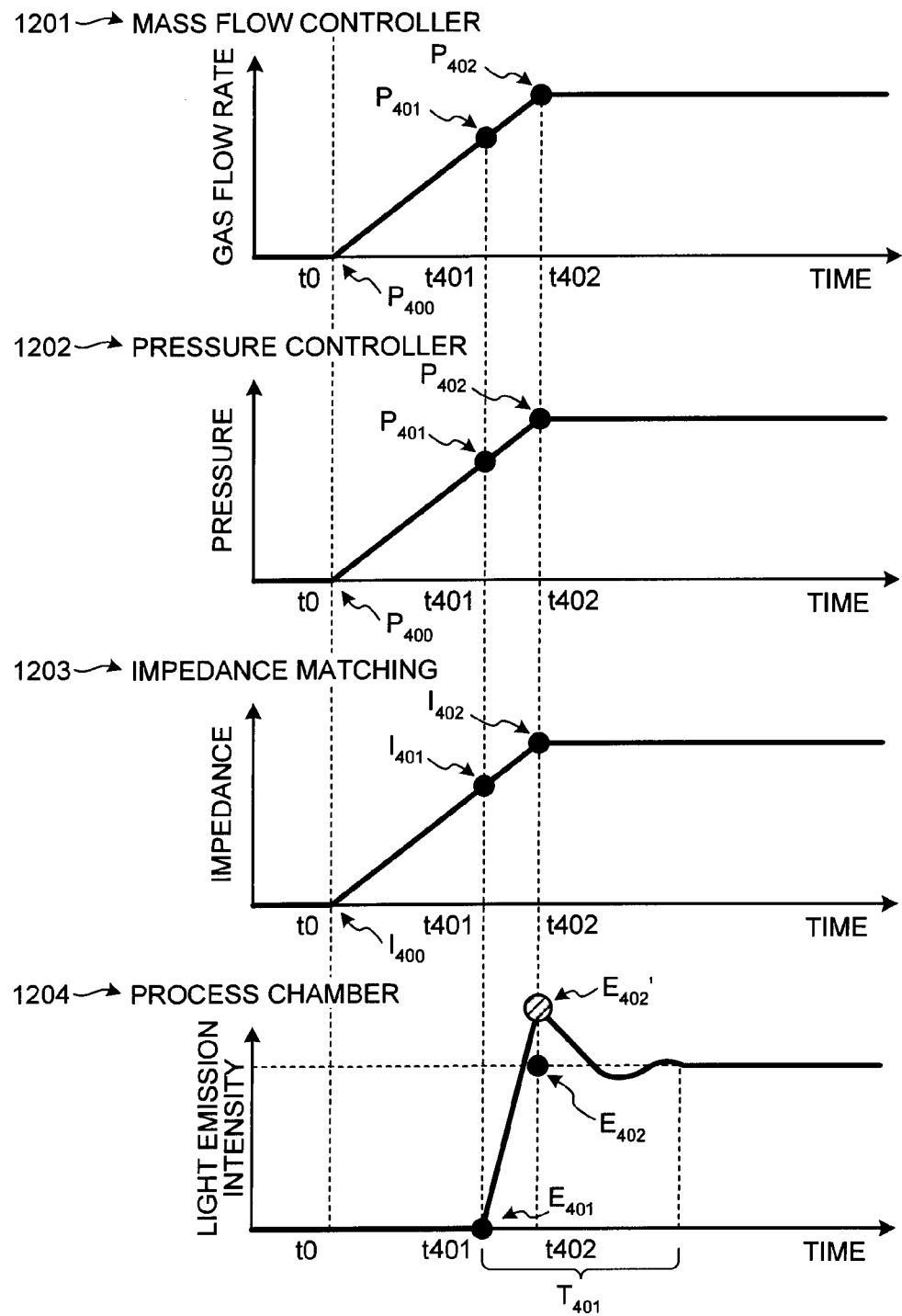
FIG. 12 is a view showing an impedance matching operation in a comparative example.

Here, a case will be tentatively examined in which when process conditions are switched in a continuous process as shown in FIG. 12, impedances are matched using a matching value MV401 which matches an objective impedance to an impedance value I401 corresponding to a light emission intensity E401 at a timing t401 before switching and a matching value MV402 which matches an objective impedance to an impedance value I402 corresponding to a light emission intensity E402 at a timing t402 which is planned as after switching. In the case, at the timing t402 which is planned as after switching, a light emission intensity of plasma is stronger than a predetermined value and is still in an unstable state, and there is a high possibility that a light emission intensity E402' of the plasma PL in the process chamber 90 at the timing t402 at which switching is being performed overshoots beyond the light emission intensity E402 corresponding to the matching information stored in the storage unit 282 (refer to graphs 1201 to 1204 of FIG. 12). As a result, since a long time is necessary to stabilize the light emission intensity E402 of the plasma PL, there is a tendency that a time necessary to match impedances and to stabilize plasma, i.e., a switching time T401 becomes long.

In contrast, in the fourth embodiment, the storage unit 282 stores the matching information including the first matching value MV21 which corresponds to the timing t1 of the light emission start state (the first light emission intensity) and which matches an objective impedance to the impedance value I21, the third matching value MV22 which corresponds to the light emission intensity at the timing t2 in a halfway state (a transient state) where the light emission start state (the first light emission intensity) is being switched to the light emission stable state (the second light emission intensity) using the process gas A (the transient state) and which matches an objective impedance to the impedance value I22, and the second matching value MV23 which corresponds to the light emission intensity at the timing t3 of the stable state after the switching to the light emission stable state (the second light emission intensity) using the process gas A has been finished and which matches an objective impedance to the impedance value I23). As a result, when the light emission start state (the first light emission intensity) is switched to the light emission stable state (the second light emission intensity) using the process gas A, impedances can be sequentially matched to the first matching value MV21, to the third matching value MV22, and to the second matching value MV23.

That is, when the matching circuit 22 refers to the matching information, impedances are sequentially matched to the first matching value MV21 at the switch start timing t1 at which the light emission start state (the first light emission intensity) is switched to the light emission stable state (the second light emission intensity) using the process gas A, to the third matching value MV22 at the timing t2 while the switching is being performed (the transient state), and to the second matching value MV23 at the timing t3 at which the switching has been finished. With the operation, since the light emission intensity of the plasma PL can be suppressed from overshooting in a halfway state (a transient state) where the process conditions are being switched, impedances can be matched and the switch time T21 necessary to stabilize plasma can be reduced.

Further, in a case shown in FIG. 12, since there is a high possibility that the light emission intensity E402' of the plasma PL in the process chamber 90 overshoots beyond the light emission intensity E402 corresponding to the matching information stored in the storage unit 282 while the switching is being performed, a charge-up is liable to be generated on a surface of the substrate WF to be processed as a processing target. When the charge-up is generated on the surface of the substrate WF to be processed, there is a possibility that a device (for example, a transistor) formed on the surface of the substrate WF to be processed is electrically broken.

In contrast, in the fourth embodiment, since the light emission intensity of the plasma PL can be suppressed from overshooting in the halfway state (the transient state) where the process conditions are being switched, a charge-up is difficult to be generated on the surface of the substrate WF to be processed as the processing target. As a result, a device (for example, a transistor) formed on the surface of the substrate WF to be processed can be suppressed from being electrically broken.

Further, in the fourth embodiment, the change rate of impedance from the switch start timing (the light emission start state) to the switch completion timing (the light emission stable state using the process gas A) can be lower than the change rate from the impedance change start timing to the switch start timing to the switch start timing (the light emission start state). For example, as shown in FIG. 7, the temporal change rate of impedance from the impedance I21 at the timing t1 of the light emission start state to the impedance I23 at the timing t3 of the light emission stable state can become lower than the temporal change rate of impedance from the impedance I20 at the timing t0 of the initial state to the impedance I21 at the timing t1 of the light emission start state. As a result, the light emission intensity of the plasma PL can be more effectively suppressed from overshooting in the halfway state (the transient state) where the process conditions are being switched.

Note that a control may be performed without using the flow rate control information and the pressure control information. That is, the gas flow rate and the pressure may be controlled likewise the first embodiment. In the case, in a process for experimentally obtaining the matching information shown in FIG. 8, a flow of steps is changed such that the process at step S13 is omitted as well as step S2 is performed after step S12 (refer to a broken arrow shown at S12 of FIG. 8). Further, in the case, the matching information may be stored in the storage unit 224 of the power supply control unit 220 instead of being stored in the storage unit 282 of the controller 280. Otherwise, the matching information may be stored in the storage unit 224 of the power supply control unit 220 in addition to that the matching information is stored in the storage unit 282 of the controller 280.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power supply control device of a plasma processing device having a plasma generation unit which generates plasma in a process chamber, the power supply control device comprising:
    a radio frequency power supply which supplies a power to the plasma generation unit;
    a storage unit which stores matching information including a first matching value, a second matching value, and a third matching value, the first matching value corresponding to process information of a first process condition, the second matching value corresponding to process information of a second process condition, and the third matching value corresponding to process information of a transient state where the first process condition is being switched to the second process condition; and
    a matching circuit which matches impedances based on the matching information.

2. The power supply control device according to claim 1, wherein when the first process condition is switched to the second process condition, the matching circuit sequentially matches impedances to the first matching value, the third matching value, and the second matching value by referring to the matching information.

3. The power supply control device according to claim 2, wherein the matching circuit matches an impedance to the first matching value at a timing when the first process condition starts to be switched to the second process condition, matches an impedance to the third matching value at a transient timing when the first process condition is being switched to the second process condition, and matches an impedance to the second matching value at a timing when the first process condition has been switched to the second process condition.

4. The power supply control device according to claim 1, wherein the first matching value, the second matching value, and the third matching value correspond to flow rates of the types of process gases and to a pressure in the process chamber, respectively.

5. The power supply control device according to claim 4, wherein the first matching value, the second matching value, and the third matching value further correspond to a temperature of a substrate to be processed, respectively.

6. The power supply control device according to claim 4, wherein the first matching value, the second matching value, and the third matching value further correspond to a power of the radio frequency power supply, respectively.

7. A plasma processing device comprising:
    a plasma generation unit which generates plasma in a process chamber; and
    a power supply control unit including a radio frequency power supply, a storage unit, and a matching circuit, the radio frequency power supply supplying a power to the plasma generation unit, a storage unit storing matching information including a first matching value, a second matching value, and a third matching value, the matching circuit matching impedances based on the matching information, the first matching value corresponding to process information of a first process condition, the second matching value corresponding to process information of a second process condition, and the third matching value corresponding to process information of a transient state where the first process condition is being switched to the second process condition.

8. The plasma processing device according to claim 7, wherein when the first process condition is switched to the second process condition, the matching circuit sequentially matches impedances to the first matching value, the third matching value, and the second matching value by referring to the matching information.

9. The plasma processing device according to claim 8, wherein the matching circuit matches an impedance to the first matching value at a timing when the first process condition starts to be switched to the second process condition, matches an impedance to the third matching value at a transient timing when the first process condition is being switched to the second process condition, and matches an impedance to the second matching value at a timing when the first process condition has been switched to the second process condition.

10. The plasma processing device according to claim 7, wherein the first matching value, the second matching value, and the third matching value correspond to flow rates of the types of process gases and to a pressure in the process chamber, respectively.

11. The plasma processing device according to claim 10 wherein the first matching value, the second matching value, and the third matching value further correspond to a temperature of a substrate to be processed, respectively.

12. The plasma processing device according to claim 10, wherein the first matching value, the second matching value, and the third matching value further correspond to a power of the radio frequency power supply, respectively.

13. The plasma processing device according to claim 7 further comprising:
    a gas supply control unit which controls a flow rate of a process gas supplied to the process chamber;
    a pressure control unit which controls a pressure of the process chamber; and
    a controller which controls the power supply control unit, the gas supply control unit, and the pressure control unit,
    wherein the controller includes a second storage unit which stores the matching information, the flow rate control information, and the pressure control information;
    the flow rate control information includes a first flow rate control value, a second flow rate control value, and a third flow rate control value, the first flow rate control value corresponding to process information of the first process condition, the second flow rate control value corresponding to process information of the second process condition, and the third flow rate control value corresponding to process information of a transient state in which the first process condition is being switched to the second process condition; and
    the pressure control information includes a first pressure control value, a second pressure control value, and a third pressure control value, the first pressure control value corresponding to process information of the first process condition, the second pressure control value corresponding to process information of the second process condition, and the third pressure control value corresponding to process information of a transient state in which the first process condition is being switched to the second process condition.

14. The plasma processing device according to claim 7 further comprises:
a bias application unit which applies a bias voltage to plasma generated in the process chamber by the plasma generation unit; and
the second power supply control unit that includes a second radio frequency power supply and a third storage unit, and a second matching circuit, the second radio frequency power supply supplying a power to the bias application unit, the third storage unit storing second matching information including a fourth matching value, a fifth matching value, and a sixth matching value, the second matching circuit configured to match impedances based on the second matching information, the fourth matching value corresponding to process information of the first process condition, the fifth matching value corresponding to process information of the second process condition, and the sixth matching value corresponding to process information of a transient state in which the first process condition is being switched to the second process condition.

15. A plasma processing method in a plasma processing device that has a plasma generation unit which generates plasma in a process chamber and a power supply control unit which supplies a power to the plasma generation unit, the plasma processing method comprising:
obtaining, in the plasma processing device, matching information including a first matching value, a second matching value, and a third matching value, the first matching value corresponding to process information of a first process condition, the second matching value corresponding to process information of a second process condition, and the third matching value corresponding to process information of a transient state in which the first process condition is being switched to the second process condition;
matching an impedance of the power supply control unit to the obtained first matching value;
matching the impedance of the power supply control unit to the obtained third matching value after the impedance is matched to the first matching value; and
matching the impedance of the power supply control unit to the obtained second matching value after the impedance is matched to the third matching value.

16. The plasma processing method according to claim 15 wherein
the matching to the first matching value is performed at a timing when the first process condition starts to be switched to the second process condition;
the matching to the third matching value is performed at a transient timing when the first process condition is being switched to the second process condition; and
the matching to the second matching value is performed at a timing when the first process condition has been switched to the second process condition.

17. A power supply control device of a plasma processing device having a plasma generation unit which generates plasma in a process chamber, the power supply control device comprising:
a radio frequency power supply which supplies a power to the plasma generation unit;
a storage unit which stores matching information including a first matching value, a second matching value, and a third matching value, the first matching value corresponding to a first plasma light emission intensity, the second matching value corresponding to a second plasma light emission intensity, and the third matching value corresponding to a plasma light emission intensity of a transient state in which the first plasma light emission intensity is being switched to the second plasma light emission intensity; and
a matching circuit which matches impedances based on the matching information.

18. A plasma processing device comprising:
a plasma generation unit which generates plasma in a process chamber; and
a power supply control unit including a radio frequency power supply, a storage unit, and a matching circuit, the radio frequency power supply supplying a power to the plasma generation unit, a storage unit storing matching information including a first matching value, a second matching value, and a third matching value, the matching circuit matching impedances based on the matching information, the first matching value corresponding to a first plasma light emission intensity, the second matching value corresponding to a second plasma light emission intensity, and the third matching value corresponding to a plasma light emission intensity of a transient state in which the first plasma light emission intensity is being switched to the second plasma light emission intensity.

19. The plasma processing device according to claim 18 comprising:
a detection unit which detects the generated plasma light emission intensity; and
a calculation unit which calculates the first matching value so that the detected plasma light emission intensity becomes the first plasma light emission intensity, and which calculates the third matching value so that the detected plasma light emission intensity becomes a light emission intensity of a transient state in which the first plasma light emission intensity is being switched to the second plasma light emission intensity, and which calculates the second matching value so that the detected plasma light emission intensity becomes the second plasma light emission intensity.

20. A plasma processing method in a plasma processing device that has a plasma generation unit which generates plasma in a process chamber and a power supply control unit which supplies a power to the plasma generation unit, the plasma processing method comprising:
obtaining, in the plasma processing device, matching information including a first matching value, a second matching value, and a third matching value, the first matching value corresponding to a first plasma light emission intensity, the second matching value corresponding to a second plasma light emission intensity, and the third matching value corresponding to a light emission intensity of a transient state in which the first plasma light emission intensity is being switched to the second plasma light emission intensity;
matching an impedance of the power supply control unit to the obtained first matching value;
matching the impedance of the power supply control unit to the obtained third matching value after the impedance is matched to the first matching value; and matching the impedance of the power supply control unit to the obtained second matching value after the impedance is matched to the third matching value.

* * * * *